(12) United States Patent
Chai et al.

(10) Patent No.: US 12,255,140 B2
(45) Date of Patent: Mar. 18, 2025

(54) SEMICONDUCTOR DEVICE AND LAYOUT METHOD OF THE SAME

(71) Applicant: SAMSUNG ELECTRONICS CO., LTD., Suwon-si (KR)

(72) Inventors: Seungil Chai, Seoul (KR); Kyunghee Shin, Gwangmyeong-si (KR); Daehee Lee, Yongin-si (KR); Moonhui Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 423 days.

(21) Appl. No.: 17/867,195

(22) Filed: Jul. 18, 2022

(65) Prior Publication Data

US 2023/0132080 A1 Apr. 27, 2023

(30) Foreign Application Priority Data

Oct. 21, 2021 (KR) .................. 10-2021-0141121

(51) Int. Cl.
*H01L 23/528* (2006.01)
*H01L 23/522* (2006.01)
*H10B 41/35* (2023.01)

(52) U.S. Cl.
CPC ...... *H01L 23/5283* (2013.01); *H01L 23/5226* (2013.01); *H10B 41/35* (2023.02)

(58) Field of Classification Search
CPC .. H01L 23/5283; H01L 23/5226; H10B 41/35
USPC ....................................................... 257/369
See application file for complete search history.

(56) References Cited

U.S. PATENT DOCUMENTS

| | | | |
|---|---|---|---|
| 4,613,941 | A | 9/1986 | Smith et al. |
| 5,936,875 | A | 8/1999 | Kim et al. |
| 6,070,108 | A | 5/2000 | Andreev et al. |
| 6,388,277 | B1 | 5/2002 | Kobayashi et al. |
| 6,505,333 | B1 | 1/2003 | Tanaka |
| 7,703,059 | B2 | 4/2010 | Murray et al. |

(Continued)

FOREIGN PATENT DOCUMENTS

| | | |
|---|---|---|
| KR | 1992-0003568 A | 2/1992 |
| KR | 1998-041939 A | 8/1998 |
| KR | 10-2014-0001578 A | 1/2014 |

*Primary Examiner* — Tu-Tu V Ho
(74) *Attorney, Agent, or Firm* — Sughrue Mion, PLLC

(57) ABSTRACT

A semiconductor device, includes a plurality of semiconductor elements, each of the plurality of semiconductor elements including a gate structure extending in a first direction and an active region provided on both sides of the gate structure in a second direction intersecting the first direction; and a plurality of interconnection patterns connected to the plurality of semiconductor elements, wherein the plurality of interconnection patterns include a plurality of upper interconnections provided above the plurality of semiconductor elements in a third direction, a plurality of intermediate interconnections provided between the plurality of semiconductor elements and the plurality of upper interconnections in the third direction, and a routing interconnection adjacent to at least one of the plurality of semiconductor elements in the second direction, wherein the routing interconnection is connected to at least one of the plurality of intermediate interconnections in the first direction or the second direction.

20 Claims, 15 Drawing Sheets

(56) References Cited

U.S. PATENT DOCUMENTS

| | | | |
|---|---|---|---|
| 7,930,660 B2 * | 4/2011 | Ruderer | G03F 1/44 |
| | | | 716/54 |
| 8,219,959 B2 | 7/2012 | Dirks et al. | |
| 2004/0117753 A1 | 6/2004 | Kahng et al. | |
| 2009/0113368 A1 | 4/2009 | Lin et al. | |
| 2014/0001564 A1 | 1/2014 | Song et al. | |
| 2014/0131885 A1 | 5/2014 | Samadi et al. | |
| 2014/0282325 A1 | 9/2014 | Chen et al. | |
| 2016/0335389 A1 | 11/2016 | Yuan et al. | |
| 2019/0065647 A1 | 2/2019 | Chen et al. | |
| 2019/0103392 A1 | 4/2019 | Chang et al. | |

\* cited by examiner

SEMICONDUCTOR DEVICE AND LAYOUT METHOD OF THE SAME

CROSS TO REFERENCE TO RELATED APPLICATION(S)

This application is based on and claims priority from Korean Patent Application No. 10-2021-0141121 filed on Oct. 21, 2021 in the Korean Intellectual Property Office, the disclosure of which is incorporated herein by reference in its entirety.

BACKGROUND

The disclosure relates to a semiconductor device and a layout method of the same.

A semiconductor device may include a plurality of semiconductor elements formed on a semiconductor substrate. In this case, interconnections for connecting the semiconductor elements, and the like, and may be designed by providing and connecting standard cells pre-defined in a library. As a degree of integration of semiconductor elements increases, various methods for efficiently providing interconnections for connecting semiconductor elements are being proposed.

SUMMARY

According to an aspect of the disclosure, there is provided a semiconductor device capable of increasing a degree of freedom of design and efficiently disposing interconnections, by additionally providing a routing filler cell including a routing interconnection, to connect standard cells to each other using an intermediate interconnection included in at least a portion of the standard cells, to connect standard cells to each other using an intermediate interconnection included in at least a portion of the standard cells, and a layout method thereof.

According to an aspect of the disclosure, there is provided a semiconductor device, including: a plurality of semiconductor elements, each of the plurality of semiconductor elements including a gate structure extending in a first direction, parallel to an upper surface of a substrate, and an active region provided on both sides of the gate structure in a second direction intersecting the first direction; and a plurality of interconnection patterns connected to the plurality of semiconductor elements, wherein the plurality of interconnection patterns include: a plurality of upper interconnections provided above the plurality of semiconductor elements in a third direction perpendicular to the upper surface of the substrate, a plurality of intermediate interconnections provided between the plurality of semiconductor elements and the plurality of upper interconnections in the third direction, and a routing interconnection extending in the first direction and adjacent to at least one of the plurality of semiconductor elements in the second direction, a length of the routing interconnection in the first direction is greater than a length of the active region in first direction, wherein the routing interconnection is connected to at least one of the plurality of intermediate interconnections in the first direction or the second direction.

According to another aspect of the disclosure, there is provided a semiconductor device, including: a plurality of standard cells arranged in a first direction and a second direction, the first and the second direction being parallel to an upper surface of a substrate and intersecting each other, and each of the plurality of standard cells including a plurality of semiconductor elements; and a plurality of filler cells provided adjacent to one or more of the plurality of standard cells, the plurality of filler cells including a routing filler cell, wherein the routing filler cell includes a routing interconnection connected, via an intermediate interconnection, to at least one of the plurality of semiconductor elements included in a neighboring standard cell that is adjacent to the routing filler cell in the second direction, wherein the routing interconnection extends in the first direction parallel to a gate structure of each of the plurality of semiconductor elements, and wherein the intermediate interconnection and the routing interconnection are provided at a same height as contacts connected to the plurality of semiconductor elements.

According to an aspect of the disclosure, there is provided a semiconductor device, including: a plurality of standard cells arranged in a first direction, parallel to an upper surface of a substrate and a second direction intersecting the first direction and including a first standard cell and a second standard cell, each of the plurality of standard cells including a plurality of semiconductor elements; and a plurality of filler cells provided adjacent to one or more of the plurality of standard cells, the plurality of filler cells including a first routing filler cell and a second routing filler cell, wherein the first routing filler cell includes a first routing interconnection connected to a first gate structure of the first standard cell via a first intermediate interconnection, and the second routing filler cell includes a second routing interconnection connected to a second gate structure of the second standard cell via a second intermediate interconnection, wherein the first routing interconnection, the second routing interconnection, the first intermediate interconnection, and the second intermediate interconnection are provided at a same height, wherein the first intermediate interconnection is connected to the first routing interconnection in the second direction at a first boundary between the first standard cell and the first routing filler cell, and wherein the second intermediate interconnection is connected to the second routing interconnection in the second direction at a second boundary between the second standard cell and the second routing filler cell.

According to an aspect of the disclosure, there is provided a layout method of a semiconductor device including a plurality of standard cells, the layout method including: selecting two or more standard cells including a first standard cell and a second standard cell from among the plurality of standard cells in a standard cell library; providing the two or more standard cells in a first direction and a second direction intersecting the first direction; providing a first routing filler cell adjacent to the first standard cell and a second routing filler adjacent to the second standard cell; providing a first intermediate interconnection to connect a first gate structure of the first standard cell to a first routing interconnection of the first routing filler cell at a same height as the first routing interconnection, and providing a second intermediate interconnection connecting a second gate structure of the second standard cell to a second routing interconnection of the second routing filler cell at a same height as the second routing interconnection; and providing a plurality of upper interconnections to connect the standard cells to each other.

According to an aspect of the disclosure, there is provided a semiconductor device, including: a first standard cell, a second standard cell and a third standard cell arranged in a first direction, each of the first standard cell, the second standard cell and the third standard cell including one or more semiconductor elements; a first routing filler cell arranged adjacent to the first standard cell; a second routing filler cell arranged between the second standard cell and the third standard cell, wherein the first routing filler cell includes a first routing interconnection connected to a first semiconductor element of the first standard cell via a first intermediate interconnection, and the second routing filler cell includes a second routing interconnection connected to a second semiconductor element of the second standard cell via a second intermediate interconnection, wherein the first routing interconnection, the second routing interconnection, the first intermediate interconnection, and the second intermediate interconnection are provided at a same height.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the accompanying drawings.

Figure 1:
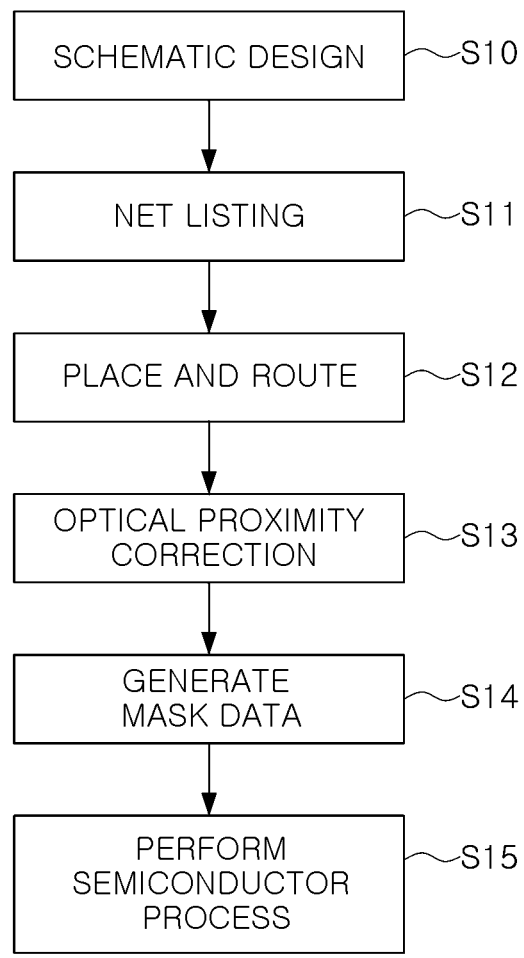
FIG. 1 is a flowchart illustrating a method of manufacturing a semiconductor device according to an example embodiment of the disclosure.

FIG. 1 is a flowchart provided to illustrate a method of manufacturing a semiconductor device according to an example embodiment of the disclosure.

Referring to FIG. 1, a method of manufacturing a semiconductor device according to an example embodiment of the disclosure may start with a schematic design (S10). In the schematic design, circuits to be included in a semiconductor device may be designed and verified. In order to actually implement a circuit that has been designed and verified in the schematic design on a semiconductor substrate such as a wafer, a layout design may be performed.

When the design and verification of circuits in the schematic design are completed, a net listing operation for generating net list data may be executed (S11). For example, a circuit determined in the schematic design may be described in a higher language of a computer language, and this may be converted into net list data. The net list data may include standard cells and data defining a connection relationship between the standard cells. Moreover, the net list data may be generated by a semiconductor design tool. The standard cells may provide various circuits such as AND, OR, NOR, an inverter, Or And Inverter (OAI), And Or Inverter (AOI), flip-flop, latch, or the like.

Thereafter, a place and route operation for generating layout data with reference to the net list data may be executed (S12). The place and route operation (S12) may be executed with reference to a layout of standard cells stored in a library. A semiconductor design tool for executing the place and route operation may generate layout data including placement information of standard cells and routing information connecting the placed standard cells by referring to a library and net list data in which standard cells are stored.

When the place and route operation (S12) is completed, optical proximity correction (S13) may be executed on the layout data generated by the place and route operation. When the optical proximity correction (S13) is completed, mask data for forming various patterns on a plurality of layers may be generated (S14). Exposure may be performed on a photoresist, or the like is performed using the mask data and a mask is generated, and thereafter, a semiconductor process using the mask may be performed (S15), thereby manufacturing a semiconductor device.

According to an example embodiment, the place and route operation may be separated into a place operation and a route operation. In the place operation, the standard cells may be provided in standard cell regions, and empty spaces between the standard cell regions may be allocated as filler cell regions and may be filled with filler cells. In the route operation, interconnections for connecting semiconductor elements included in the standard cells to each other may be formed. However, the disclosure is not limited thereto, and as such, according to another example embodiment, the place and route operation may not be separated into the place operation and the route operation.

According to an example embodiment, in each of the standard cells, positions of at least a portion of interconnection patterns for connecting semiconductor elements may be pre-defined, and for example, interconnection patterns necessary for implementing a circuit provided by the standard cells may be pre-defined. The interconnection patterns for connecting the semiconductor elements to each other may include intermediate interconnections and upper interconnections. In an example embodiment, the intermediate interconnections may be interconnections provided between upper interconnections and semiconductor elements. For example, a region in which semiconductor elements are provided may be defined as a Front End Of Line (FEOL) layer, a region in which intermediate interconnections are provided may be defined as a Middle Of Line (MOL) layer, and a region in which upper interconnections are provided may be defined as a Back End Of Line (BEOL) layer. However, according to example embodiments, the interconnections may include lower interconnections provided at the same height as the semiconductor elements.

According to an example embodiment, at least a portion of the intermediate interconnections may connect semiconductor elements included in one standard cell and separated from each other. Intermediate interconnections provided in different standard cells are connected to each other through lower interconnections and/or upper interconnections, thus providing a routing path connecting the standard cells to each other.

Depending on a dispositional structure of the standard cells, it may be difficult for an intermediate interconnection to connect the semiconductor elements to each other. That is, it may be difficult for an intermediate interconnection to connect the standard cells to each other. In an example embodiment of the disclosure, a routing filler cell may be additionally provided to be adjacent to a standard cell in the case as described above, and the intermediate interconnection may be connected to the lower interconnection and/or the upper interconnection through a routing interconnection included in the routing filler cell. The routing interconnection may be an interconnection provided at the same height as the intermediate interconnection.

In addition, in an example embodiment of the disclosure, when it is impossible to secure a path for connecting an intermediate interconnection between at least one of standard cells and a lower interconnection and/or an upper interconnection, as mentioned above, an operation of additionally providing a routing filler cell may execute automatically. Accordingly, a time required for the layout design may be reduced, and semiconductor elements included in the semiconductor device may be effectively connected to each other.

Figure 2:
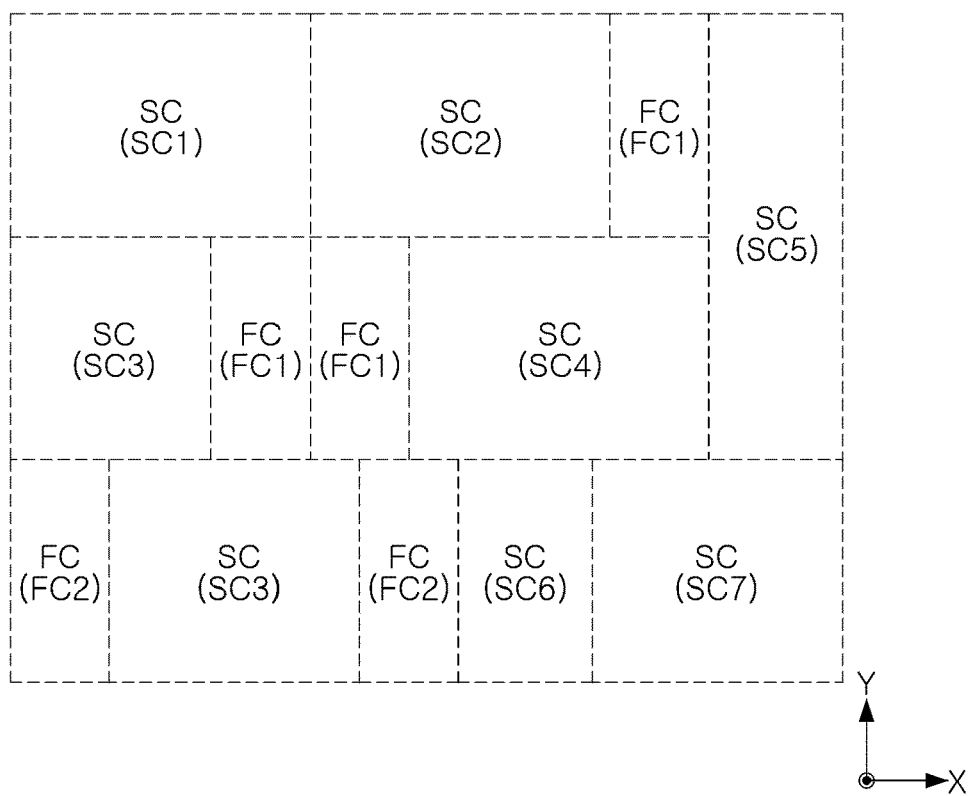
FIG. 2 is a plan view illustrating a semiconductor device according to an example embodiment of the disclosure.

FIG. 2 is a plan view illustrating a semiconductor device according to an example embodiment of the disclosure.

Referring to FIG. 2, a semiconductor device may include standard cell regions SC and filler cell regions FC. Standard cells SC1-SC7 may be provided in the standard cell regions SC, and the standard cells SC1 to SC7 may provide semiconductor elements and/or circuits that actually operate. Filler cells FC1-FC2 may be provided in the filler cell regions FC.

Although it is illustrated that first to seventh standard cells SC1-SC7 are provided in the standard cell areas SC in example embodiments illustrated in FIG. 2, this is merely an example embodiment, and more various standard cells may be provided in a greater number of standard cell regions. Similarly, although it is illustrated that first and second filler cells FC1-FC2 are provided in filler cell regions FC, more various filler cells may be provided in a greater number of filler cell regions.

The standard cells SC1-SC7 and the filler cells FC1-FC2 may be arranged in a first direction (Y-axis direction) and a second direction (X-axis direction). For example, each of the semiconductor elements included in the standard cells SC1-SC7 may include a gate structure extending in a first direction, and a source region and a drain region provided on both sides of the gate structure in a second direction.

At least one of the standard cells SC1-SC7 may include an intermediate interconnection. The intermediate interconnection may be an interconnection connecting semiconductor elements included in one standard cell to each other, and for example, provided at the same height as a gate contact connected to a gate structure and an active contact connected to at least one of a source region and a drain region.

In an example embodiment of the disclosure, at least one of the filler cells FC1-FC2 may provide a routing interconnection connecting an intermediate interconnection of an adjacent standard cell with another interconnection, for example, an upper interconnection and/or a lower interconnection. For example, referring to FIG. 2, the intermediate interconnection included in the third standard cell SC3 may be connected to the an upper interconnection and/or a lower interconnection extending in a second direction through the routing interconnection included in the adjacent first filler cell FC1. The first filler cell FC1 adjacent to the third standard cell SC3 may be defined as a routing filler cell. For example, in the process of providing the standard cells SC1-SC7 and the filler cells FC1-FC2 and designing the layout, in order to connect the intermediate interconnection included in the third standard cell SC3 with other interconnections, the first filler cell FC1 may be automatically additionally provided at a position adjacent to the third standard cell SC3.

Figure 3:
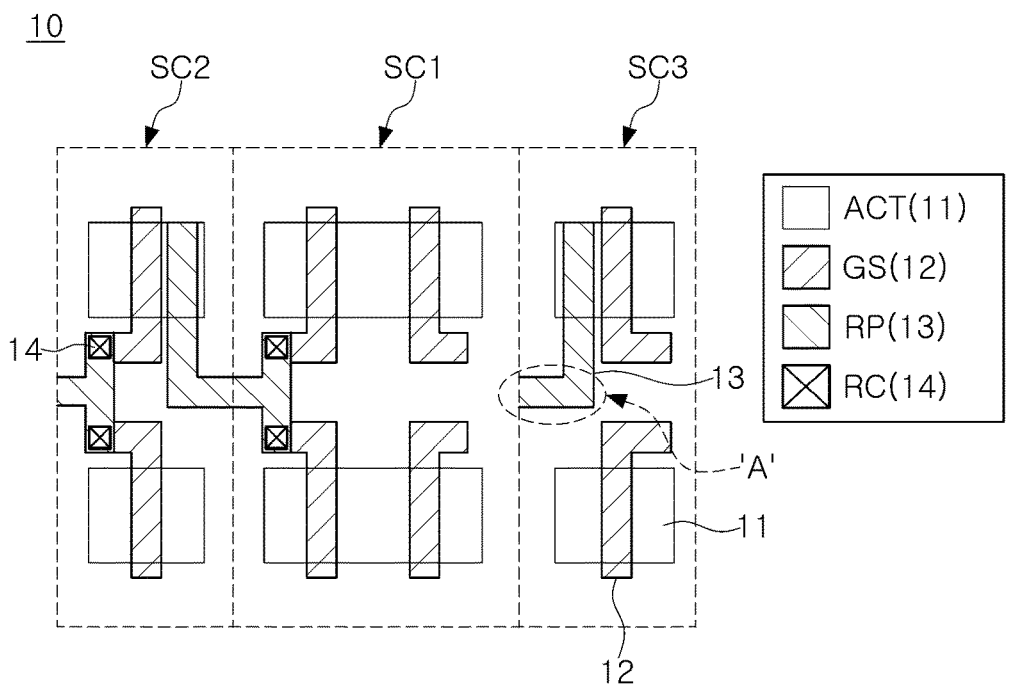
FIGS. 3 and 4 are plan views schematically illustrating a partial region of a semiconductor device according to an example embodiment of the disclosure.
Figure 4:
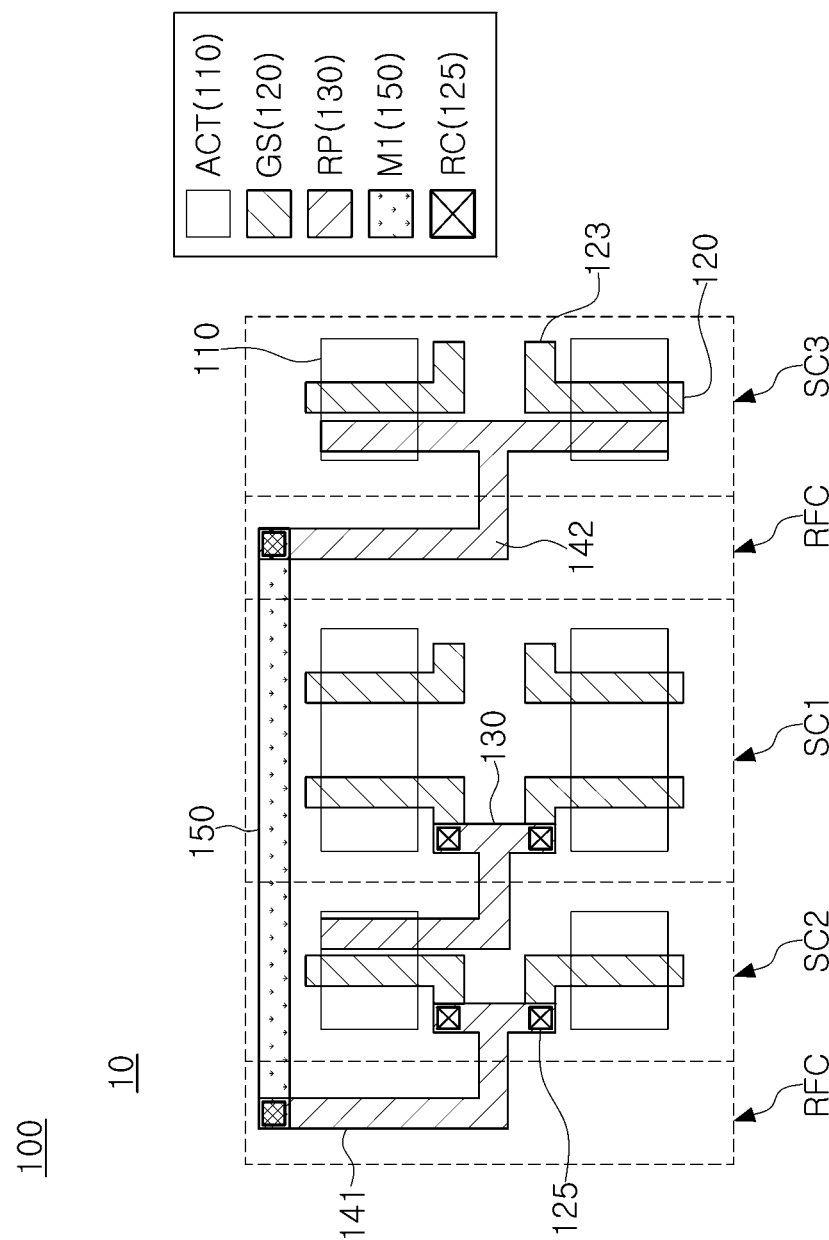

FIGS. 3 and 4 may be diagrams provided to illustrating a method of routing a semiconductor device according to an example embodiment of the disclosure.

FIG. 3 is a plan view illustrating a partial region of a semiconductor device 10 according to comparative example. Referring to FIG. 3, the semiconductor device 10 may include a plurality of standard cells, and each of the standard cells SC1-SC3 may include semiconductor elements. For example, each of the semiconductor elements included in the standard cells SC1-SC3 may include an active region 11 and a gate structure 12. The gate structure 12 may extend in a first direction (Y-axis direction), and the active region 11 may include a source region and a drain region adjacent to both sides of the gate structure 12 in a second direction (X-axis direction).

Meanwhile, each of the standard cells SC1-SC3 may include an intermediate interconnection 13. The intermediate interconnection 13 may connect semiconductor elements included in one of the standard cells SC1-SC3 to each other, and may also connect semiconductor elements included in different standard cells SC1-SC3 to each other. Referring to FIG. 3, a gate structure 12 of a first semiconductor device and a gate structure 12 of a second semiconductor device included in the first standard cell SC1 may be connected to each other by the intermediate interconnection 13. In addition, the gate structure 12 of the first semiconductor device and the gate structure 12 of the second semiconductor device included in the first standard cell SC1 may be connected to the active region 11 of the first semiconductor device included in the second standard cell SC2 may be connected through the intermediate interconnection 13.

However, in an example embodiment illustrated in FIG. 3, a filler cell may not be provided between the standard cells SC1-SC3, and thus at least one of the intermediate interconnections 13 may not be connected to semiconductor elements of other standard cells SC1-SC3. For example, referring to FIG. 3, the intermediate interconnection provided in the region 'A' may be connected to the active region 11 of each of the first semiconductor device and the second semiconductor device of the third standard cell SC3. The intermediate interconnection 13 provided in the region 'A' may have to be connected to the intermediate interconnection 13 connected to the gate structures 12 of each of the first semiconductor device and the second semiconductor device in the second standard cell SC2.

In the example embodiment illustrated in FIG. 3, due to the intermediate interconnection 13 connecting the first standard cell SC1 and the second standard cell SC2, it may be difficult to connect an intermediate interconnection 13 connected to the gate structure 12 in the second standard cell SC2 and an intermediate interconnection 13 connected to the active region 11 in the third standard cell SC3 to each other. In this case, upper interconnections provided above the semiconductor elements and intermediate interconnections 13 in a third direction (Z-axis direction) may be used, but if the upper interconnections are already occupied by other signal interconnections, the intermediate interconnection 13 connected to the gate structure 12 in the second standard cell SC2 and the intermediate interconnection 13 may still not be connected.

In an example embodiment of the disclosure, it is possible to solve the above problem by further providing a routing filler cell including a routing interconnection between standard cells SC1-SC3. Referring to FIG. 4, the semiconductor device 100 according to an example embodiment may further include a routing filler cell RFC in addition to the standard cells SC1-SC3. Each of the semiconductor elements included in the standard cells SC1-SC3 may include an active region 110, a gate structure 120, an intermediate interconnection 130, and the like, and the gate structure 120 may include a gate tap structure 123 extending in a second direction between the active regions adjacent in the first direction. For example, by forming the gate tab structure 123, it is possible to prevent the gate structure 120 from collapsing.

The routing filler cell RFC may be further provided between the first standard cell SC1 and the second standard cell SC2, and the second standard cell SC2 and the third standard cell SC3, respectively. According to an example embodiment illustrated in FIG. 4, a first routing filler cell RFC is provided adjacent to the second standard cell SC2, and a second routing filler cell RFC is provided between the first standard cell SC1 and the third standard cell SC3. Each of the routing filler cell RFC may include routing interconnections 141 and 142, and the routing interconnections 141 and 142 may be connected to the intermediate interconnection 130 of the standard cell adjacent to the routing filler RFC in at least one of a first direction and a second direction. In other words, the routing interconnections 141 and 142 may be provided at the same height as the intermediate interconnection 130.

The routing interconnections 141 and 142 included in the routing filler cells RFC may extend in the first direction, and may be connected to each other through the upper interconnection 150 provided above the intermediate interconnection 130 in the third direction. As illustrated in FIG. 4, in an example embodiment of the disclosure, by further inserting the routing filler cell RFC, a routing path for connecting an intermediate interconnection 130 provided in each of the second standard cell SC2 and the third standard cell SC3, separated from each other, may be secured. For example, the routing filler cell RFC may not include the active region 110 and the gate structure 120. Also, according to another example embodiment, the routing interconnections between the routing filler cells RFC may be connected to each other through a lower interconnection provided below the intermediate interconnection 130 in the third direction.

Figure 5:
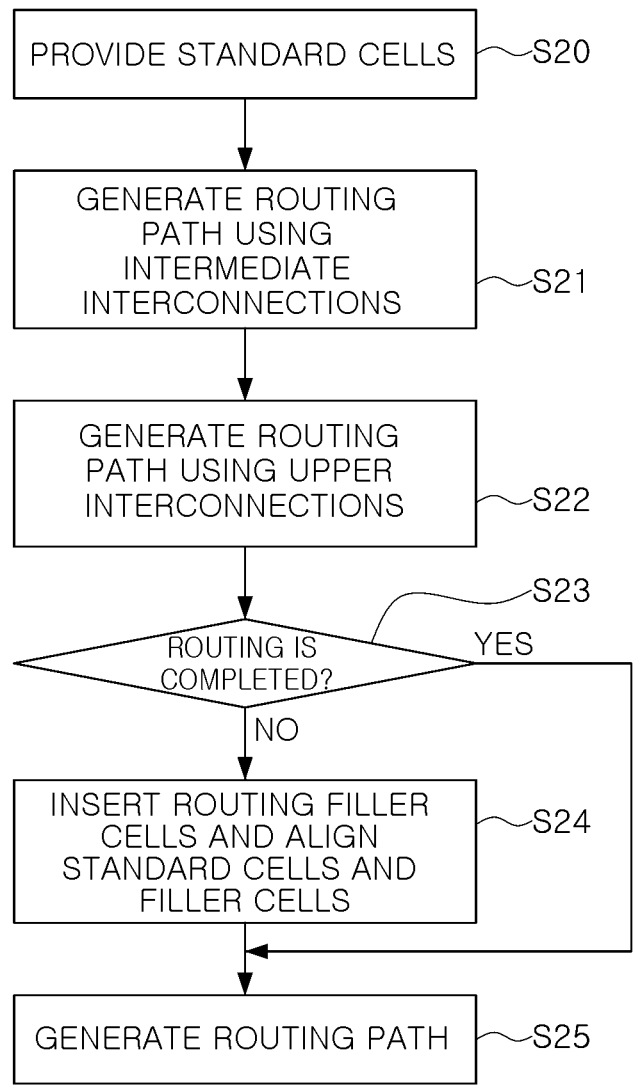
FIG. 5 is a flowchart illustrating a layout method of a semiconductor device according to an example embodiment of the disclosure.

FIG. 5 is a flowchart provided to illustrate a layout method of a semiconductor device according to an example embodiment of the disclosure.

Referring to FIG. 5, a layout method of a semiconductor device according to an example embodiment of the disclosure may start with providing standard cells (S20). Standard cells may be provided in standard cell regions, and in an example embodiment of the disclosure, standard cells may be provided without gaps. In other words, in the operation of S20, a filler cell may not be provided together with the standard cells.

Each of the standard cells may include at least one intermediate interconnection. The intermediate interconnection may connect semiconductor elements provided separated from each other in each of the standard cells, and may connect for example, a PMOS device and an NMOS device to each other. The intermediate interconnection may be provided above the semiconductor elements, and for example, may be formed at the same height as a gate contact, a source contact, a drain contact, and the like. For example, in standard cells, at least a portion of the intermediate interconnections provided between the PMOS device and the NMOS device may be connected to each other through at least one of the upper interconnections provided on the intermediate interconnections.

When the standard cells are provided, a routing path may be created using intermediate interconnections (S21) and upper interconnections (S22). The upper interconnections are interconnections provided in a higher position than the intermediate interconnections, and at least a portion of the intermediate interconnections may be connected to each other by at least one of the upper interconnections.

Thereafter, it may be determined whether routing using the intermediate interconnections and the upper interconnections is completed (S23). If it is determined that routing is completed in operation S23, a routing path may be created by further providing the remaining interconnections (S25). On the other hand, if it is determined in operation S23 that routing is not completed, an additional operation for connecting standard cells that are not connected to each other may be executed.

In an example embodiment, the upper interconnections extend along at least one of directions parallel to an upper surface of a substrate, and may be arranged according to a specific rule. According to an example embodiment, the specific rule may be a predetermined rule. As described above, since the position and number of upper interconnections are limited according to the design rule, a space for connecting at least one of the intermediate interconnections with another intermediate interconnection and/or the upper interconnection may not be secured.

In an example embodiment of the disclosure, in the case as described above, by further inserting a routing filler and aligning standard cells and filler cells (S24), a routing operation may be completed. The routing filler cell may include at least one routing interconnection, and the routing interconnection may be connected to each other at the same height as at least one intermediate interconnection among the standard cells adjacent to the routing filler cell. The routing interconnection provided within the routing filler cell may freely extend along at least one of directions parallel to an upper surface of the substrate, thereby securing a space for connecting at least one of intermediate interconnections to another intermediate interconnection and/or upper interconnection via a routing interconnection.

Figure 6:
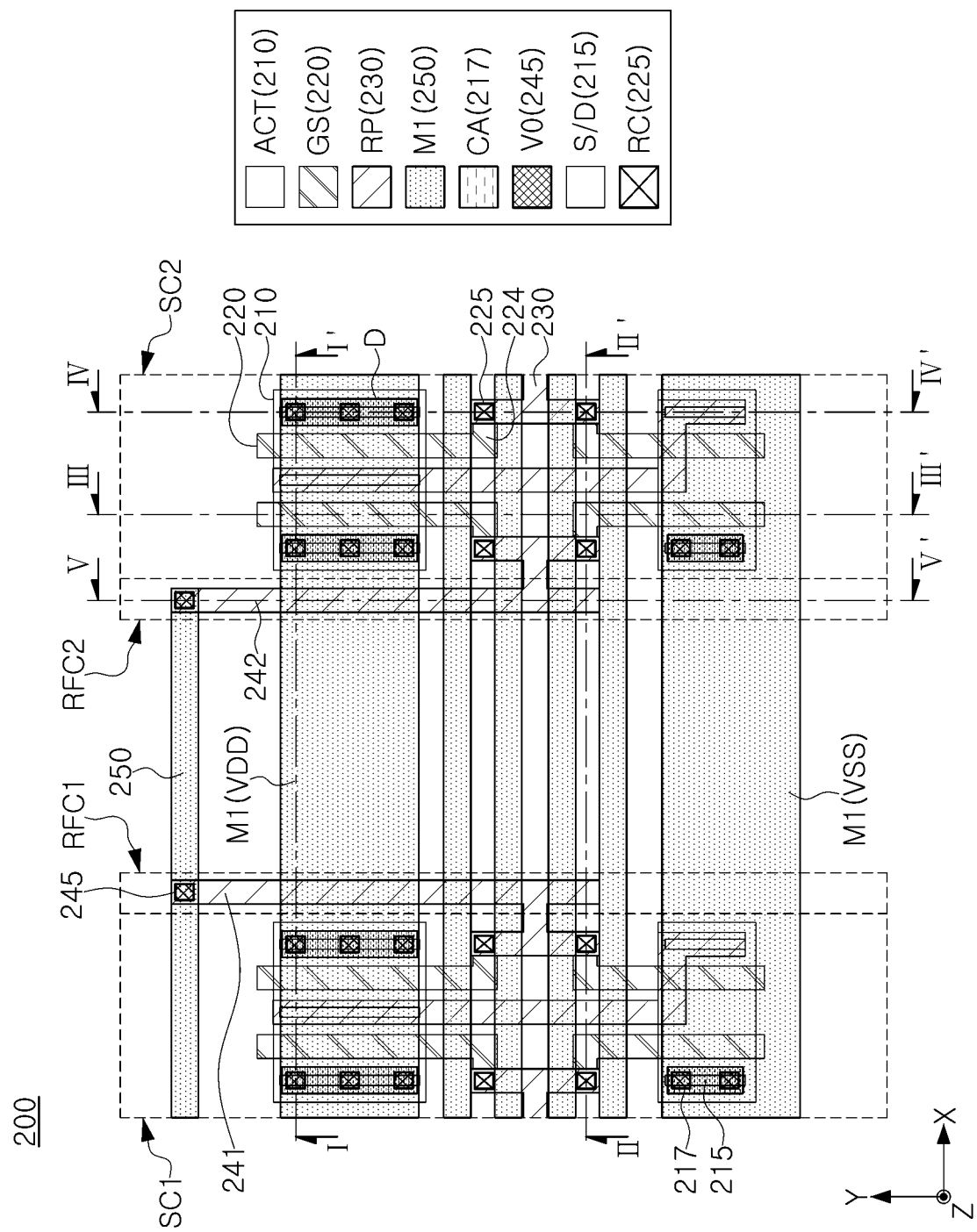
FIG. 6 is a schematic plan view illustrating a partial region of semiconductor device according to an example embodiment of the disclosure.

FIG. 6 is a schematic plan view illustrating a partial region of a semiconductor device according to an example embodiment of the disclosure.

Referring to FIG. 6, a semiconductor device 200 according to an example embodiment of the disclosure may include a first standard cell SC1 and a second standard cell SC2, a first routing filler cell RFC1 and a second routing filler cell RFC2. FIG. 6 illustrates a partial region of the semiconductor device 200, and the semiconductor device 200 may include more standard cells and routing filler cells in addition to the standard cells SC1 and SC2 and the routing filler cells RFC1 and RFC2 illustrated in FIG. 6.

Each of the first standard cell SC1 and the second standard cell SC2 may include a plurality of semiconductor elements, and each semiconductor element may include an active region 210, a gate structure 220, and the like. The gate structure 220 may extend in a first direction (Y-axis direction), and the active region 210 may be connected to a lower active contact 215 provided on both sides of the gate structure 220 in a second direction (X-axis direction).

Each of the first standard cell SC1 and the second standard cell SC2 may include semiconductor elements that are separated from each other in the first direction, and doped with impurities of different conductivity types. For example, in the example embodiment illustrated in FIG. 6, each of the standard cells SC1 and SC2 may include a PMOS device and an NMOS device. An active region 210 of the PMOS device may extend further than the active region 210 of the NMOS device in the first direction. The active region 210 of the PMOS device may include a semiconductor material doped with a P-type impurity, and the active region 210 of the NMOS device may include a semiconductor material doped with an N-type impurity.

For example, a lower active contact 215 connected to the active region 210 may include a metal and/or a metal silicide material. At least one of the lower active contacts 215 may be connected to an upper active contact 217 provided thereon. For example, both the lower active contact 215 and the upper active contact 217 may extend in a second direction. The upper active contact 217 may connect at least one of the plurality of upper interconnections 250 extending in the second direction to the lower active contact 215.

For example, a portion D of the active regions 210 included in the PMOS device in the first standard cell SC1 may be connected to a first power interconnection M1 (VDD) for supplying a first power voltage through the lower active contact 215 and the upper active contact 217. In addition, one of the active regions 210 included in the NMOS device in the first standard cell SC1 may be connected to a second power interconnection M1 (VSS) for supplying a second power voltage through the lower active contact 215 and the upper active contact 217.

Meanwhile, in each of the standard cells SC1 and SC2, at least one lower active contact 215 of the active regions 210 may be connected to the intermediate interconnection 230 rather than the upper active contacts 217. For example, referring to FIG. 6, an active region 210 provided between a pair of gate structures 220 adjacent to each other in the PMOS device may be connected to the intermediate interconnection 230 through the lower active contact 215, and may be connected to one of the active regions 210 of the NMOS device through the intermediate interconnection 230.

In other words, the lower active contact 215 may be connected to the intermediate interconnection 230 or may be connected to the upper active contact 217. Both the intermediate interconnection 230 and the upper active contact 217 may be provided at a height in direct contact with the lower active contact 215, and thus may be provided at the same height as each other. In an example embodiment, the intermediate interconnection 230 and the upper active contact 217 may be formed of the same material in the same process, and the intermediate interconnection 230 and the upper active contact 217 may be terms defined according to their functions. For example, the intermediate interconnection 230 may indicate an interconnection pattern provided to connect the active regions 210 and/or the gate structures 220 of different elements to each other, and the upper active contact 217 may indicate an interconnection pattern for connecting the active region 210 to at least one of the plurality of upper interconnections 250.

Each of the gate structures 220 may include a gate tap structure 224 extending in a second direction, and for example, the gate tab structure 224 may be provided between the PMOS element and the NMOS element in the first direction. Referring to FIG. 6, gate structures 220 provided at the same position in the second direction and separated from each other in the first direction in each of the standard cells SC1 and SC2 may be connected to each other by an intermediate interconnection 230. The gate structures 220 may be connected to the intermediate interconnection 230 through a routing contact 225 connected to the gate tab structure 224. Accordingly, a pair of gate structures 220 may receive the same signal in each of the standard cells SC1 and SC2.

In the example embodiment illustrated in FIG. 6, an intermediate interconnection 230 connecting a pair of gate structures 220 in the first standard cell SC1 and an intermediate interconnection 230 connecting a pair of gate structures 220 in the second standard cell SC2 may need to be connected to each other. However, upper interconnections 250 provided between the PMOS element and the NMOS element in the first direction and used as signal interconnections may all be occupied by different signals. In this case, routing filler cells RFC1 and RFC2 may be inserted to connect the intermediate interconnection 230 of the first standard cell SC1 and the intermediate interconnection 230 of the second standard cell SC2.

The first routing filler cell RFC1 may be provided to be adjacent to the first standard cell SC1, and may include a first routing interconnection 241. The first standard cell SC1 may be a neighboring standard cell for the first routing filler cell RFC1. The first routing wire 241 may be adjacent to at least one of the semiconductor elements included in the first standard cell SC1 in the second direction. Meanwhile, the second routing filler cell RFC2 may be provided to be adjacent to a second standard cell SC2, and may include a second routing interconnection 242. A neighboring standard cell for the second routing filler cell RFC2 may be a second standard cell SC2. The second routing interconnection 242 may be adjacent to at least one of the semiconductor elements included in the second standard cell SC2 in the second direction.

The first routing interconnection 241 may be provided at the same height as the intermediate interconnection 230, and as illustrated in FIG. 6, the intermediate interconnection connected to the pair of gate structures 220 in the first standard cell SC1 may be connected to the first routing interconnection 241. In other words, at a boundary between the first routing filler cell RFC1 and the first standard cell SC1, and the intermediate interconnection 230 of the first standard cell SC1 may be connected to the first routing interconnection 241 in the second direction. In addition, at least a portion of regions of the intermediate interconnection 230 connected to the first routing interconnection 241 may be provided at the same position as a portion of the active region 210 of the first standard cell SC1 in the second direction.

The second routing interconnection 242 may also be provided at the same height as the intermediate interconnection 230, and the intermediate interconnection 230 connected to the pair of gate structures 220 in the second standard cell SC2 may be connected to the second routing interconnection 242. In other words, at a boundary between the second routing filler cell RFC2 and the second standard cell SC2, the intermediate interconnection 230 of the second standard cell SC2 may be connected to the second routing interconnection 242 in the second direction. The first routing interconnection 241 and the second routing interconnection 242 may extend in the first direction, and may be commonly connected to the upper interconnection 250 provided above the PMOS elements in the first direction. Therefore, by the first routing interconnection 241 and the second routing interconnection 242, the intermediate interconnection 230 of the first standard cell SC1 and the intermediate interconnection 230 of the second standard cell SC2 may be connected to each other.

Each of the first routing interconnection 241 and the second routing interconnection 242 may extend longer than the active region 210 and the gate structure 220 included in each of the semiconductor elements of the standard cells SC1 and SC2 in the first direction as illustrated in FIG. 6. In addition, each of the first routing interconnection 241 and the second routing interconnection 242 may be adjacent to the semiconductor elements of the standard cells SC1 and SC2 in the second direction.

Referring to FIG. 6, the semiconductor device 200 may include a PMOS element region in which PMOS elements are provided, an NMOS element region in which NMOS elements are provided, and element isolation regions, different from the PMOS element region and the NMOS element region. For example, in each of the standard cells SC1 and SC2, the PMOS element region and the NMOS elements region, and the element isolation regions may be arranged in the first direction. The element isolation regions may include a first element isolation region between the PMOS element region and the NMOS element region, a second element isolation region provided over the PMOS element region in a first direction, and a third element isolation region provided below the NMOS element region in the first direction.

Each of the routing interconnections 241 and 242 may be connected to the intermediate interconnection 230 in the first element isolation region. For example, referring to the first standard cell SC1 and the first routing filler cell RFC1, the intermediate interconnection 230 of the first standard cell SC1 may be connected to each other in the first routing interconnection 241 and the first element isolation region. Each of the routing interconnections 241 and 242 may extend from the first element isolation region to the second element isolation region. However, according to example embodiments, at least one of the routing interconnections 241 and 242 may extend from the first element isolation region to the third element isolation region. As illustrated in FIG. 6, each of the routing interconnections 241 and 242 may be connected to at least one of the plurality of upper interconnections 250 in the second element isolation region or the third element isolation region.

In the semiconductor device 200 according to the example embodiment illustrated in FIG. 6, each of the first standard cell SC1 and the second standard cell SC2 may provide a NAND circuit. Hereinafter, a NAND circuit provided by each of the first standard cell SC1 and the second standard cell SC2 will be described in more detail with reference to FIG. 7.

Figure 7:
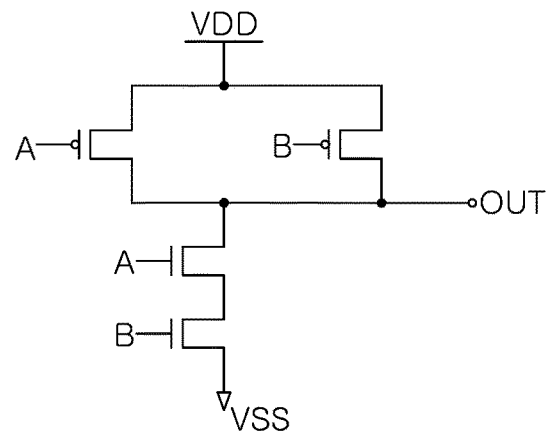
FIG. 7 is a circuit diagram schematically illustrating a circuit provided by a standard cell of the semiconductor device illustrated in FIG. 6.

FIG. 7 is a circuit diagram schematically illustrating a circuit provided by a standard cell of the semiconductor device illustrated in FIG. 6.

Referring to FIG. 7, each of the standard cells SC1 and SC2 of the semiconductor device 200 according to the example embodiment illustrated in FIG. 6 may include a NAND circuit including two PMOS elements PM1 and PM2 and two NMOS elements NM1 and NM2. The first PMOS element PM1 and the second PMOS element PM2 may be connected in parallel between a first power node supplying a first power voltage VDD and an output node outputting an output signal OUT. Referring together to the first standard cell SC1 of FIG. 6, a first input signal A and a second input signal B may be input in each of two gate structures 220 providing the PMOS elements NM1 and NM2. In addition, the active region 210 provided on both sides of the gate structures 220 in the second direction may be connected to a first power interconnection (M1(VDD)) corresponding to a first power node.

The first NMOS element NM1 and the second NMOS element NM2 may be connected in series between a second power node for supplying a second power voltage VSS and an output node. Referring together to the first standard cell SCI of FIG. 6, the first input signal A and the second input signal B may be input to each of the two gate structures 220 providing the NMOS elements NM1 and NM2. In addition, the NMOS elements NM1 and NM2 may be connected in series by the active region 210 provided between the gate structures 220 in the second direction. The active region 210 provided on one side of the gate structures 220 in the second direction may be connected to a second power interconnection M1 (VSS)) corresponding to a second power node through the lower active contact 215 and the upper active contact 217.

Meanwhile, the active region 210 provided on the other side of the gate structures 220 in the second direction may be connected to an output node through the lower active contact 215 and the intermediate interconnection 230. In other words, the intermediate interconnection 230 connecting the active region 210 of the PMOS element and the active region 210 of the NMOS element in the first standard cell SC1 may correspond to an output node OUT.

Figure 8:
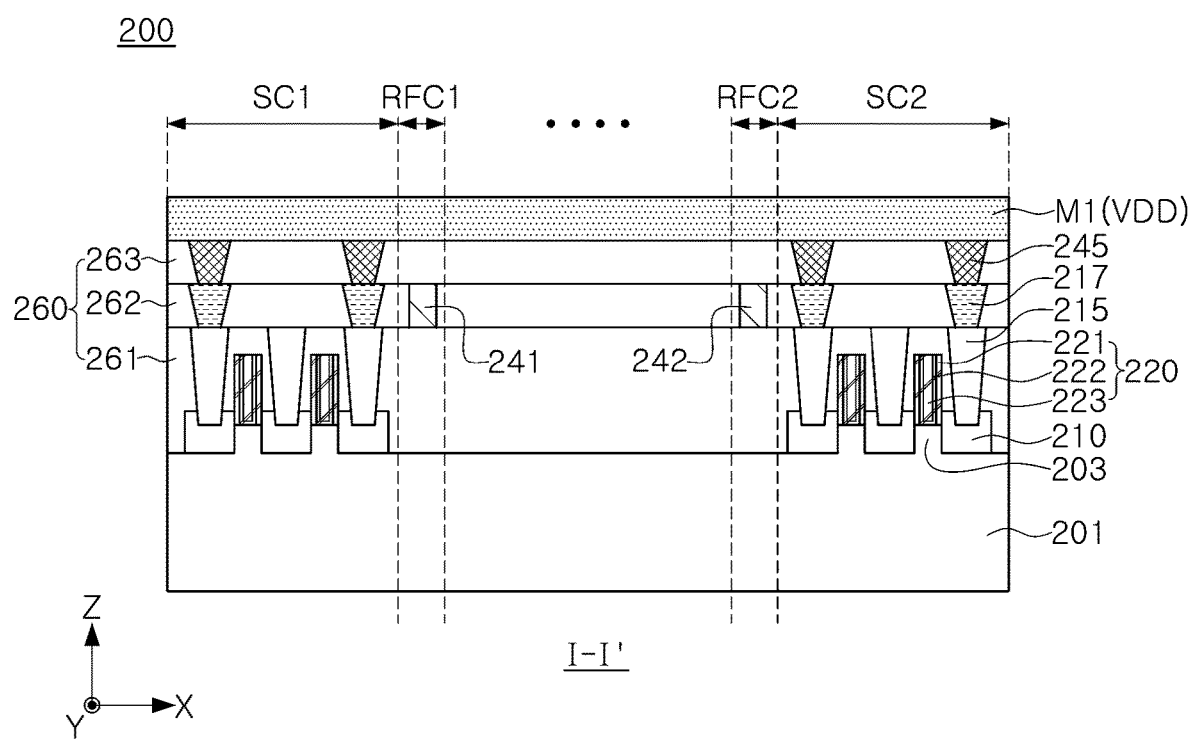
FIG. 8 is a cross-sectional view illustrating a cross-section in direction I-I' of FIG. 6.
Figure 9:
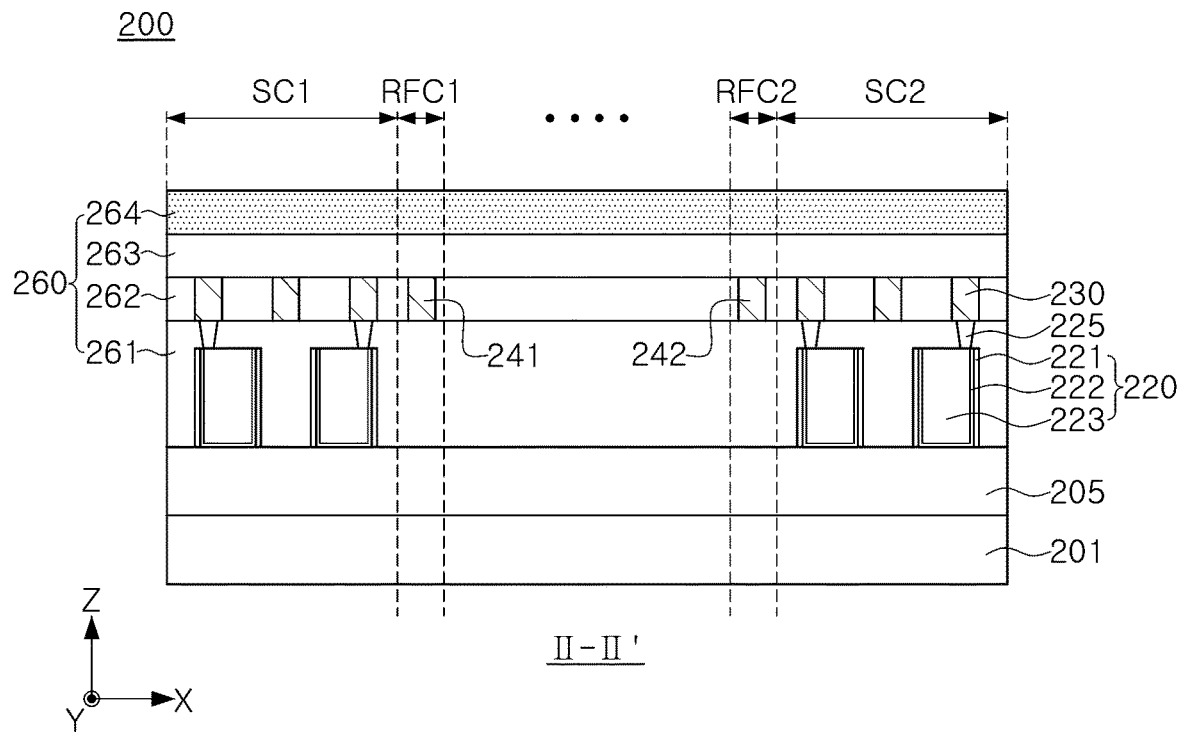
FIG. 9 is a cross-sectional view illustrating a cross-section in direction II-II' of FIG. 6.

FIG. 8 is a cross-sectional view illustrating a cross-section in direction I-I' of FIG. 6, and FIG. 9 is a cross-sectional view illustrating a cross-section in direction II-II' of FIG. 6.

Referring to FIGS. 8 and 9, in the semiconductor device 200 according to an example embodiment of the disclosure, a semiconductor device 200 according to an example embodiment of the disclosure may include active regions 210 formed on a semiconductor substrate 201, gate structures 220 provided between the active regions 210, lower active contacts 215 connected to the active regions 210, and the like. The gate structures 220 may extend in a first direction (Y-axis direction), and a channel region 203 may be defined between active regions 210 adjacent to each other in a second direction (X-axis direction), and at least one of the gate structures 220 may be provided on the channel region 203.

In the example embodiment described with reference to FIGS. 8 and 9, it is taken that the channel region 203 included in the semiconductor device 200 is provided by fin structures, may also be implemented as a nano wire, a nanosheet, or the like, formed on the semiconductor substrate 201 and surrounded by the gate structures 220. When the channel region 203 is implemented with nanowires, nanosheets, or the like, the channel region 203 may be separated from the semiconductor substrate 201 in a third direction (Z-axis direction). Alternatively, the channel region 203 may not protrude in the third direction, and upper surfaces of the active regions 210 may form a coplanar surface with an upper surface of the channel region 203. In other words, each of the semiconductor elements may also be implemented as a general horizontal transistor.

Meanwhile, as illustrated in FIG. 9, an element isolation film 205 may be formed in a region in which the channel region 203 and the active region 210 are not formed. The element isolation film 205 may be formed of an insulating material such as silicon oxide, silicon nitride, or silicon oxynitride. For example, the element isolation film 205 may also be formed between the active region 210 of the PMOS elements and the active region 210 of the NMOS elements in each of the standard cells SC1 and SC2.

Referring to FIG. 8, each of the gate structures 220 may include a gate spacer 221, a gate insulating layer 222, a gate conductive layer 223, and the like. However, a structure of each of the gate structures 220 may be variously modified according to example embodiments. For example, a thickness and/or material of the gate insulating layer 222 may be changed in consideration of a threshold voltage of each of the semiconductor elements, or a material and/or a stacked structure of the gate conductive layer 223 may be changed.

Lower active contacts 215 may be adjacent to the gate structures 220 in the second direction, and may be directly connected to the active regions 205. The lower active contacts 215 may be formed of metal, metal silicide, polysilicon, or the like, and may include two or more layers formed of different materials. For example, each of the lower active contacts 215 may include a metal silicide layer and a metal layer, and in an example embodiment, may include a metal silicide layer, in direct contact with the active regions 210, and a metal layer provided on the metal silicide layer.

A portion of the lower active contacts 215 may be connected to an upper active contact 217 provided thereon. As described above with reference to FIG. 6, two or more upper active contacts 217 may be connected to at least one of the lower active contacts 215. The upper active contacts 217 may also include a plurality of layers. The upper active contacts 217 may be connected to at least one of the upper interconnections 250 through lower vias 245. In the cross-sectional view of FIG. 8, the upper active contacts 217 may be connected to a first power interconnection M1 (VDD) through the lower vias 245. Accordingly, a first power voltage may be supplied to at least a portion of the active regions 210 of the PMOS element provided in each of the first standard cell SC1 and the second standard cell SC2.

Referring to FIG. 9, a gate tab structures 224 extending in the second direction from each gate structure 220 may be connected to the intermediate interconnection 230 through the routing contact 225. As described above, the intermediate interconnection 230 may be provided between the semiconductor elements and the upper interconnections 250 in a third direction (Z-axis direction), for example, provided at the same height as the upper active contact 217. Meanwhile, the intermediate interconnection 230 provided between a pair of gate structures 220 adjacent in the second direction in each of the standard cells SC1 and SC2 may connect one of active regions 210 of the PMOS element to one of active regions 210 of the NMOS element as described above.

A first routing interconnection 241 and a second routing interconnection 242 may be provided in a first routing filler cell RFC1 and a second routing filler cell RFC2. The first routing interconnection 241 and the second routing interconnection 242 may be provided at the same height as the intermediate interconnections 230. The first routing interconnection 241 may be connected to one of the intermediate interconnections 230 of the first standard cell SC1 in a first direction or a second direction, and the second routing interconnection 242 may be connected to one of the intermediate interconnections 230 of the second standard cell SC2 in a first direction or a second direction. By connecting the first routing interconnection 241 and the second routing interconnection 242 to one of the plurality of upper interconnections 250 in common, a routing path connecting the first standard cell SC1 and the second standard cell SC2 to each other may be effectively secured.

Meanwhile, the semiconductor device 200 may include an interlayer insulating layer 260, and the interlayer insulating layer 260 may include a plurality of interlayer insulating layers 261-264. For example, the first interlayer insulating layer 261 may be provided at the same height as the gate structures 210 and the active contacts 220, and the second interlayer insulating layer 262 may be provided at the same height as lower active contacts 215 and routing contacts 225. The third interlayer insulating layer 263 may be provided at the same height as a first interconnection layer, the fourth interlayer insulating layer 264 may be provided at the same height as upper vias 235, and the fifth interlayer insulating layer 265 may be provided at the same height as a second interconnection layer. The interlayer insulating layer 260 may be formed of silicon oxide, silicon nitride, silicon oxynitride, or the like.

Figure 10:
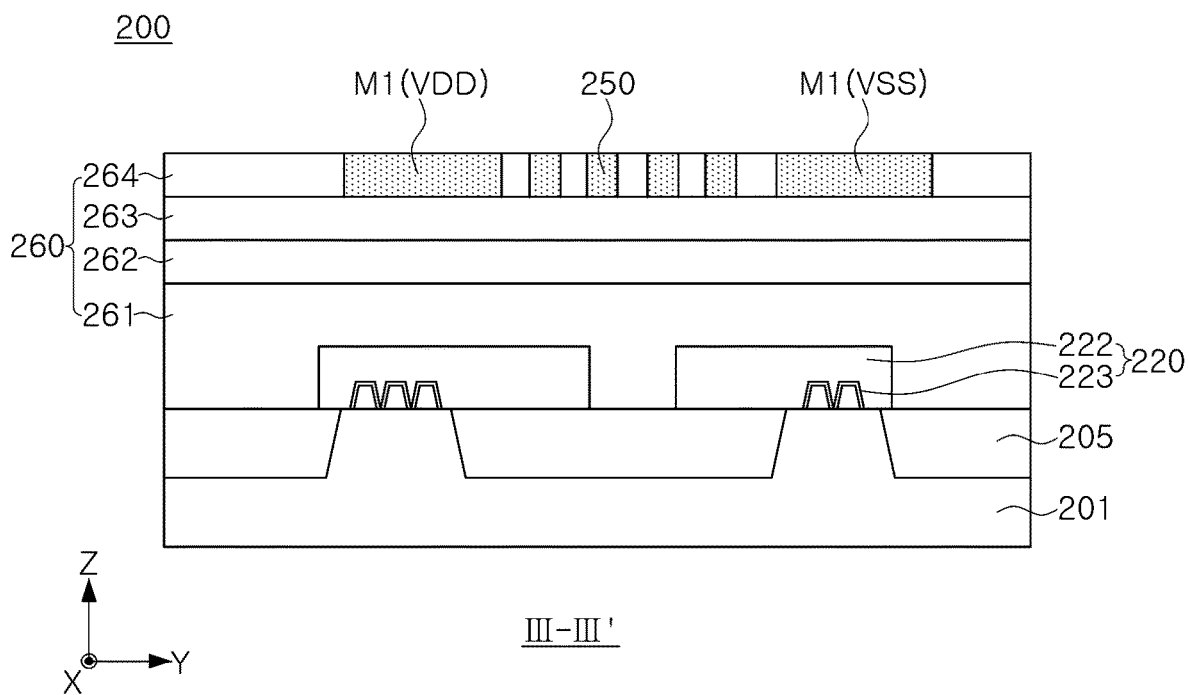
FIG. 10 is a cross-sectional view illustrating a cross-section in direction of FIG. 6.
Figure 11:
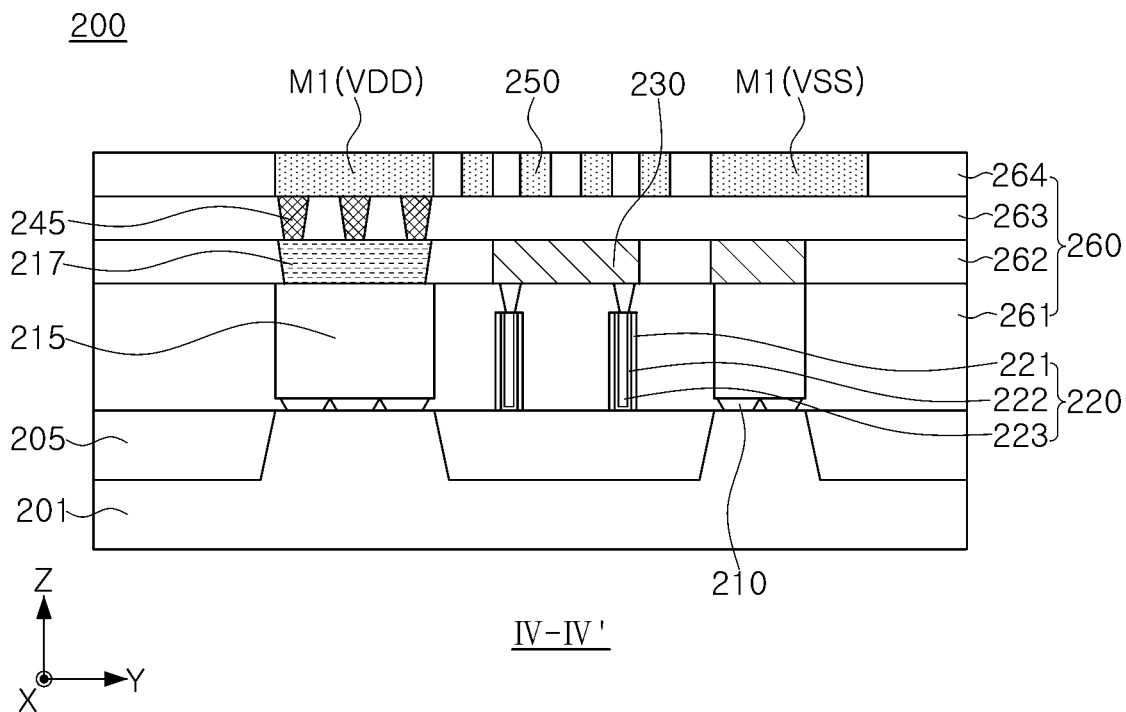
FIG. 11 is a cross-sectional view illustrating a cross section in direction IV-IV' of FIG. 6.
Figure 12:
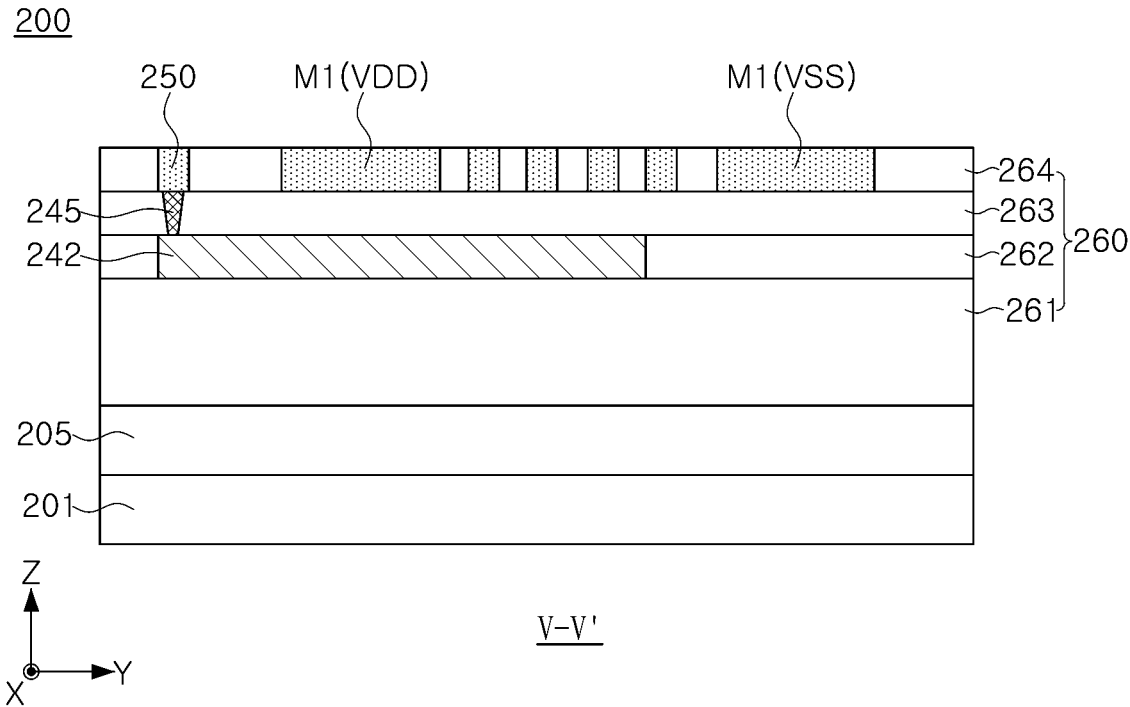
FIG. 12 is a cross-sectional view illustrating a cross-section in direction V-V' of FIG. 6.

FIG. 10 is a cross-sectional view illustrating a cross section in the III-III' direction of FIG. 6, FIG. 11 is a cross-sectional view illustrating a cross-section in direction IV-IV' of FIG. 6, and FIG. 12 is a cross-sectional view illustrating a cross section in the V-V' direction of FIG. 6.

Referring to FIGS. 10 to 12, PMOS elements may be separated from NMOS elements in each of the standard cells SC1 and SC2 by an element isolation film 205 formed on the semiconductor substrate 201. Channel regions 203 and active regions 210 may be provided on both sides of the element isolation film 205 in a first direction (Y-axis direction). Referring to FIG. 10, the channel regions 203 may be provided by fin structures protruding in a third direction (Z-axis direction), and the number of fin structures included in each of the PMOS elements may be different from the number of fin structures included in each of the NMOS elements. However, this is merely an example, and is not necessarily limited to this form.

Referring to FIG. 10, a gate insulating layer 222 of the gate structure 220 has a shape passing over the fin structures providing the channel regions 203, and a gate conductive layer 223 may be formed to cover the gate insulating layer 223 and the fin structures. Accordingly, both side surfaces and upper surfaces of the fin structures may contact the gate insulating layer 222. When the number of fin structures included in each of the PMOS element and the NMOS element is different, the gate structure 220 included in the PMOS element and the gate structure 220 included in the NMOS element may have different lengths in the first direction.

The active regions 210 may be connected to the channel region 203 in the second direction (X-axis direction). For example, the active regions 210 may be formed by applying a selective epitaxial growth process to the semiconductor substrate 201. The active regions 210 may be connected to the lower active contacts 215, and for example, the lower active contacts 215 may be formed to recess a portion of the active regions 210. The active regions 205 physically separated from each other in the second direction may be electrically connected by each of the lower active contacts 215.

A portion of the lower active contacts 215 may be connected to one of the upper interconnections 250 through the upper active contacts 217 and the lower vias 245. In addition, other portions of the lower active contacts 215 may be directly connected to the intermediate interconnection 230 provided at the same height as the upper active contacts 217. In an example embodiment illustrated in FIG. 11, the lower active contact 230 connected to the intermediate interconnection 230 may be connected to an active region 210 providing an output node in a NAND circuit.

Referring to FIG. 11, upper surfaces of the lower active contacts 215 may be positioned higher than upper surfaces of the gate structures 220. Accordingly, the gate structures 220 and the intermediate interconnection 230 may be connected to each other through a routing contact 225. For example, in the example embodiment illustrated in FIG. 11, the gate structure 220 of the PMOS element and the gate structure 220 of the NMOS element may be connected to each other by the intermediate interconnection 230, and one of input nodes of a NAND circuit may be provided. In FIG. 11, the gate structures 220 connected to the intermediate interconnection 230 may be gate tab structures 224 extending in the second direction.

As described above with reference to FIG. 6, and the like, at least a portion of the intermediate interconnections 230 may be connected to each other through the routing interconnections 241 and 242 provided in the routing filler cells RFC1 and RFC2. Referring to FIG. 12, a second routing interconnection 242 connected to one of the intermediate interconnections 230 may extend in the first direction, and may be connected to one of the upper interconnections 250 through the lower via 245. The second routing interconnection 242 may be adjacent to at least one semiconductor element in the second direction, and may extend longer than the active region 210 and/or the gate structure 220 of the semiconductor element in the first direction than the active region 210 and/or the gate structure 220 of the semiconductor element.

Referring to FIG. 12, only the element isolation layer 205 is provided below the second routing interconnection 242, and each of the routing filler cells RFC1 and RFC2 may not include a semiconductor element. Accordingly, the routing interconnections 241 and 242 may extend in the first direction without interference due to the upper active contacts 217 and the intermediate wires 230 connected to the semiconductor element, and may create a routing path effectively connecting semiconductor elements of the standard cells SC1 and SC2 using the routing interconnections 241 and 242.

Figure 13:
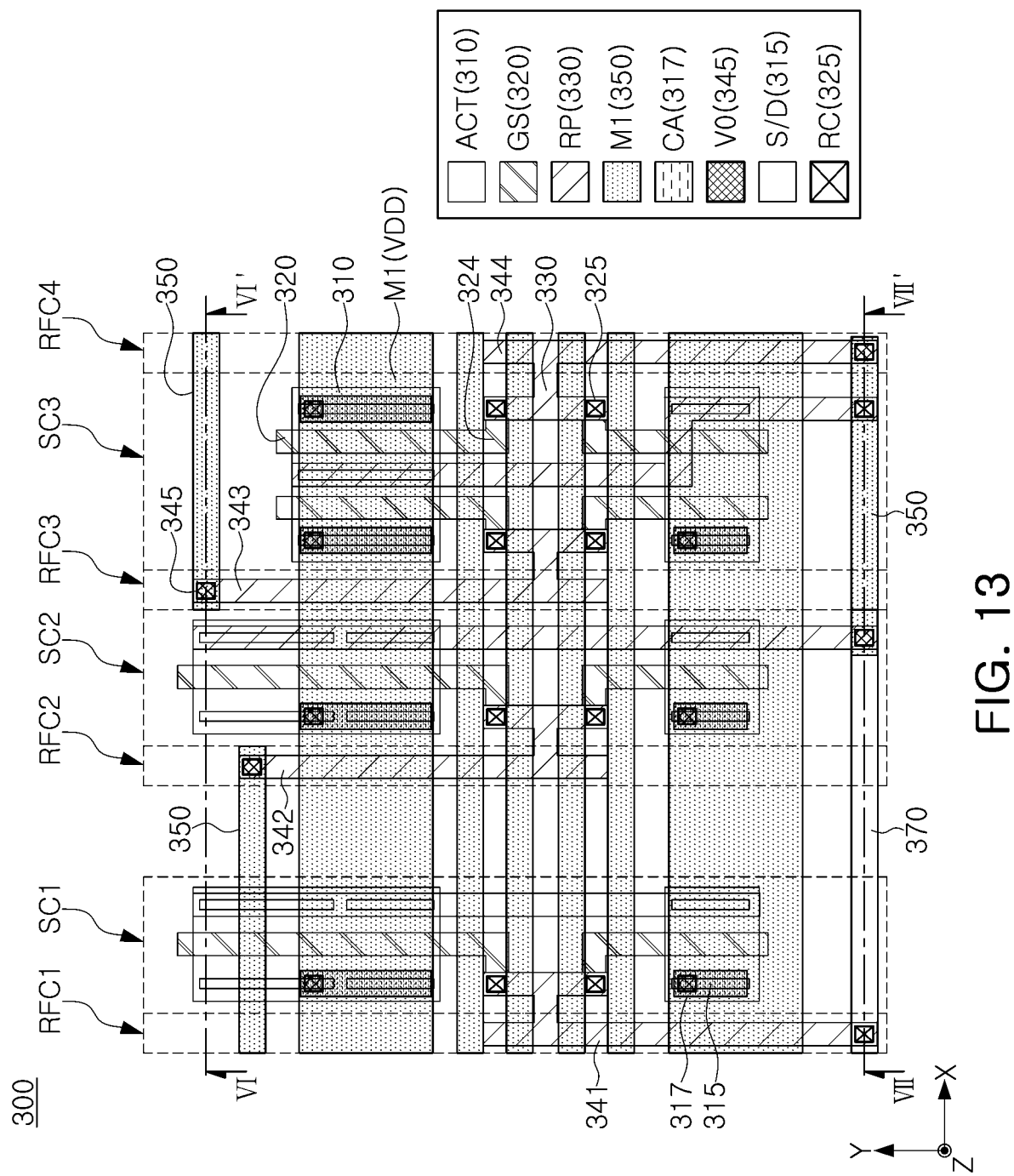
FIG. 13 is a schematic plan view of a partial region of a semiconductor device according to an example embodiment of the disclosure.

FIG. 13 is a schematic plan view of a partial region of a semiconductor device according to an example embodiment of the disclosure.

Referring to FIG. 13, a semiconductor device 300 according to an example embodiment of the disclosure may include first to standard cells SC1-SC3, first to fourth routing filler cells RFC1-RFC4. FIG. 13 is a view illustrating a partial region of the semiconductor device 300, the semiconductor device 300 may include more standard cells and routing filler cells, in addition to the standard cells SC1-SC3 and the routing filler cells RFC1-RFC4 illustrated in FIG. 13.

Each of the first to third standard cells SC1 to SC3 may include a plurality of semiconductor elements, and each of the semiconductor elements may include an active region 310, a gate structure 320, and the like. The gate structure 320 may extend in a first direction (Y-axis direction), and the active region 310 may be connected to a lower active contact 315 provided on both sides of the gate structure 320 in a second direction (X-axis direction). Each of the first to third standard cells SC1 to SC3 may include a PMOS element and an NMOS element that are separated from each other in the first direction. Other components included in the semiconductor device 300 may be similar to those described above with reference to FIG. 6.

Referring to FIG. 13, the PMOS element included in the first and second standard cells SC1 and SC2 may have a length different from that of the PMOS element included in the third standard cell SC3 in the first direction. For example, the active region 310 and the gate structure 320 included in the PMOS element of the first and second standard cells SC1 and SC2 may extend longer than the active region 310 and the gate structure 320 included in the PMOS element of the third standard cell SC3 in the first direction. Referring to FIG. 13, a length of the active region 310 included in the PMOS elements of the first and second standard cells SC1 and SC2 in the first direction may be longer than a width of a first power interconnection (M1 (VDD)) in the first direction provided above the PMOS elements.

In an example embodiment, each of the active regions 310 included in the PMOS element of the first and second standard cells SC1 and SC2 may be connected to two lower active contacts 315 separated from each other in the first direction. The two lower active contacts 315 connected to one active region 310 may have different lengths. However, this is merely an example, and the disclosure is not necessarily limited to such a form.

In the example embodiment illustrated in FIG. 13, the first standard cell SC1 and the second standard cell SC2 may provide the same circuit, for example, an inverter circuit. The third standard cell SC3 provides a circuit different from that of the first standard cell SC1 and the second standard cell SC2, and may provide, for example, a NAND circuit.

In each of the first standard cell SC1 and the second standard cell SC2, the gate structure 320 of the PMOS element and the gate structure 320 of the NMOS element may be connected to each other by the routing contact 325 and the intermediate interconnection 330. The intermediate interconnection 330 connecting the gate structures 320 may be connected to a first routing interconnection 341 of the first routing filler cell RFC1 adjacent to the first standard cell SC1. Accordingly, the first routing interconnection 341 may correspond to an input node of the inverter circuit provided by the first standard cell SC1.

Meanwhile, the intermediate interconnection 330 connecting the gate structures 320 in the second standard cell SC2 may be connected to a second routing interconnection 342 of the second routing filler cell RFC2, adjacent to the second standard cell SC2. Accordingly, the second routing interconnection 342 of the second routing filler cell RFC2 may correspond to an input node of the inverter circuit provided by the second standard cell SC2.

Meanwhile, a pair of gate structures provided at the same position in the second direction in the third standard cell SC3 and separated in the first direction may be connected to a third routing interconnection 343 of the third routing filler cell RFC3 through the intermediate interconnection 330. In addition, the intermediate interconnection 330 connected to the other pair of gate structures may be connected to a fourth routing interconnection 344 of the fourth routing filler cell RFC4. Accordingly, each of the third routing interconnection 343 and the fourth routing interconnection 344 may correspond to input nodes of the NAND circuit provided by the third standard cell SC3.

Referring to FIG. 13, the first routing interconnection 341 may be connected to the intermediate interconnection 330 connecting an active region 310 of the PMOS element to an active region 310 of the NMOS element in the third standard cell SC3 trough a lower interconnection 370. Accordingly, an output node of a NAND circuit provided by the third standard cell SC3 may be connected to an input node of the inverter circuit provided by the first standard cell SC1.

Meanwhile, the intermediate interconnection 330 connecting the active region 310 of the PMOS element to the active region 310 of the NMOS element in the second standard cell SC2 may be connected to the fourth routing interconnection 344 through an upper interconnection 350. Accordingly, the output node of the inverter circuit provided by the second standard cell SC2 may be connected to one of the input nodes of the NAND circuit provided by the third standard cell SC3.

In the example embodiment illustrated in FIG. 3, at least a portion of the routing wires 341-344 may have different lengths in the first direction. For example, the second routing interconnection 342 may have a shorter length in the first direction than the first, third, and fourth routing interconnections 341, 343, and 344. For example, the second routing interconnection 342 may have a shorter length in the first direction than the first, third, and fourth routing interconnections 341, 343, and 344. A length of each of the routing interconnections 341-344 may vary depending on the position of the upper interconnection 350 or the lower interconnection 370 connected to one end of the routing interconnections 341-344 in the first direction.

The lower interconnection 370 connected to the first routing interconnection 341 and the upper interconnection 350 connected to the fourth routing interconnection 344 may be provided to overlap in the third direction (Z-axis direction). In an example embodiment illustrated in FIG. 13, the lower interconnections 370 provided below the intermediate interconnections 330 may be used together with the intermediate interconnections 330 and the upper interconnections 350, and the routing interconnections 341-344, to effectively design a routing path. In addition, by shortening the length of the routing path, the performance of the semiconductor device 300 may be improved. Hereinafter, it will be described in more detail with reference to FIGS. 14 and 15.

Figure 14:
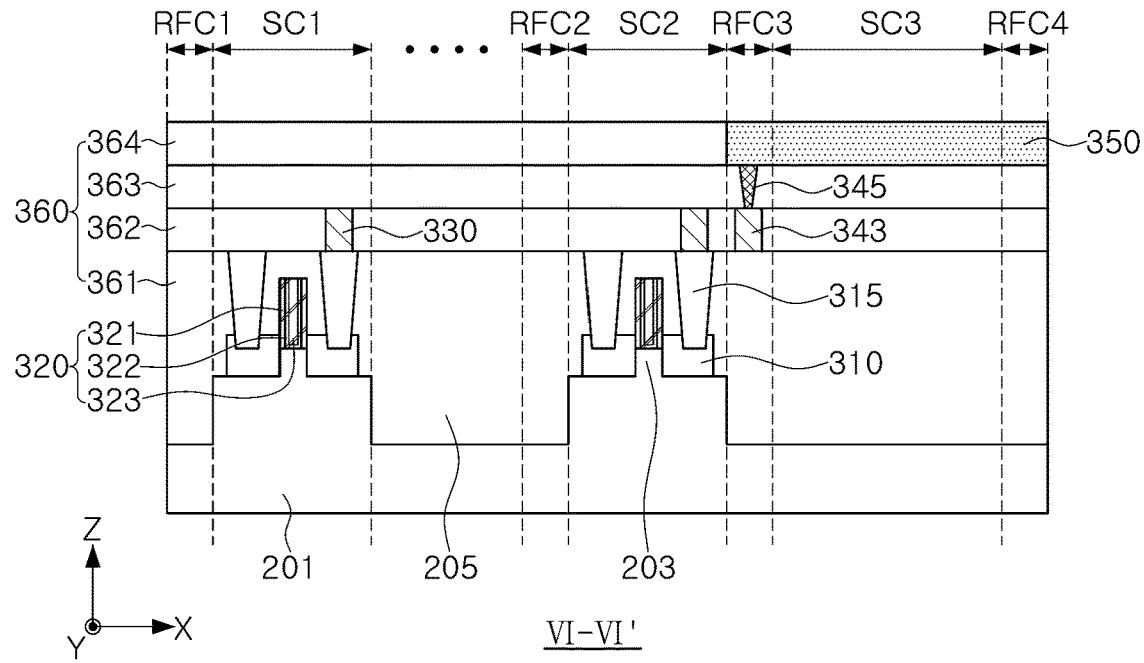
FIG. 14 is a cross-sectional view illustrating a cross-section in direction VI-VI' of FIG. 13.
Figure 15:
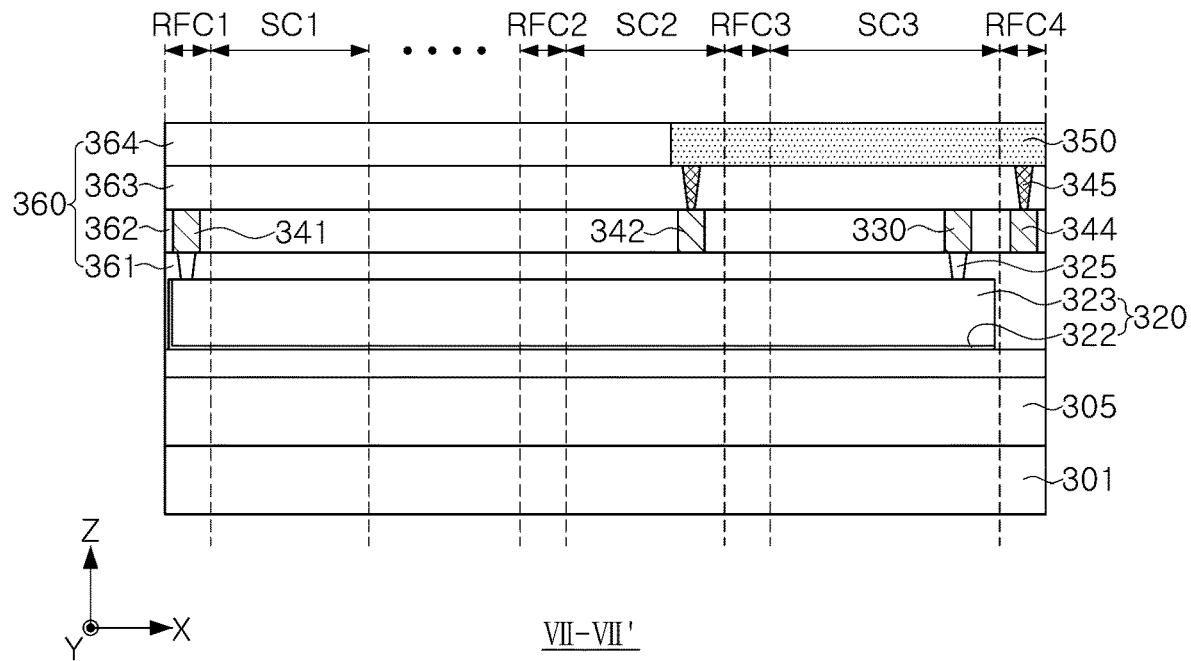
FIG. 15 is a cross-sectional view illustrating a cross-section in direction VII-VII' of FIG. 13.

FIG. 14 is a cross-sectional view illustrating a cross section in the VI-VI' direction of FIG. 13, and FIG. 15 is a cross-sectional view illustrating a cross-section in the VII-VII' direction in FIG. 13.

Referring to FIGS. 14 and 15, a semiconductor device 300 according to an example embodiment of the disclosure may include active regions 310 formed on a semiconductor substrate 301, gate structures 320 provided between the active regions 310, lower active contacts 315 connected to the active regions 310, and the like. The gate structures 320 may extend in a first direction (Y-axis direction), a channel region 303 may defined between the active regions 310 adjacent to each other in a second direction (X-axis direction), and each of the gate structure 320 may be formed to pass over the channel region 303. Meanwhile, an element isolation film 305 including an insulating material may be formed in a region in which the channel region 303 and the active region 310 are not formed.

The lower active contacts 315 may be adjacent to the gate structures 320 in the second direction, and may be directly connected to the active regions 305. The lower active contacts 315 may be formed of metal, metal silicide, polysilicon, or the like. A portion of the lower active contacts 315 may be connected to at least one of the upper interconnections 350 through an upper active contact 317 and a lower via 345 provided thereon. For example, the lower active contact 315 connected to at least one of the active regions 310 of the PMOS element may be connected to a first power interconnection M1 (VDD) through the upper active contact 317 and the lower via 345. Similarly, the lower active contact 315 connected to at least one of the active regions 310 of the NMOS element may be connected to a second power interconnection M1 (VSS) through the upper active contact 317 and the lower via 345.

In the cross-sectional view illustrated in FIG. 14, a third routing interconnection 343 connected to one of intermediate interconnections 330 of the third standard cell SC3 may be connected to one of upper interconnections 350 through the lower via 345. For example, the upper interconnection 350 connected to the third routing interconnection 343 may be allocated as an interconnection for transmitting an input signal to a NAND circuit provided by the third standard cell SC3.

Referring to FIG. 15, in at least a partial region of the semiconductor device 300, the lower interconnection 370 and the upper interconnection 350 may be provided to overlap each other in a third direction. As described above with reference to FIG. 13, the lower interconnection 370 may connect the first routing interconnection 341 to the intermediate interconnection 330 providing an output node in the third standard cell SC3. Meanwhile, the upper interconnection 350 overlapping the lower interconnection 370 may connect the intermediate interconnection 330 providing an output node in the second standard cell SC2 to a fourth routing interconnection 344.

The lower interconnection 370 may be provided at the same height as the gate structures 320, and may have the same structure as the gate structures 320. For example, the lower interconnection 370 may include a lower interconnection insulating layer 372 and a lower interconnection conductive layer 373, and the lower interconnection insulating layer 372 may include the same material as the gate insulating layer 322, and the lower interconnection conductive layer 373 may include the same material as the gate conductive layer 323. The lower interconnection 370 may be simultaneously formed in the same process as the gate structures 320, and may be formed on the element isolation film 305.

Figure 16:
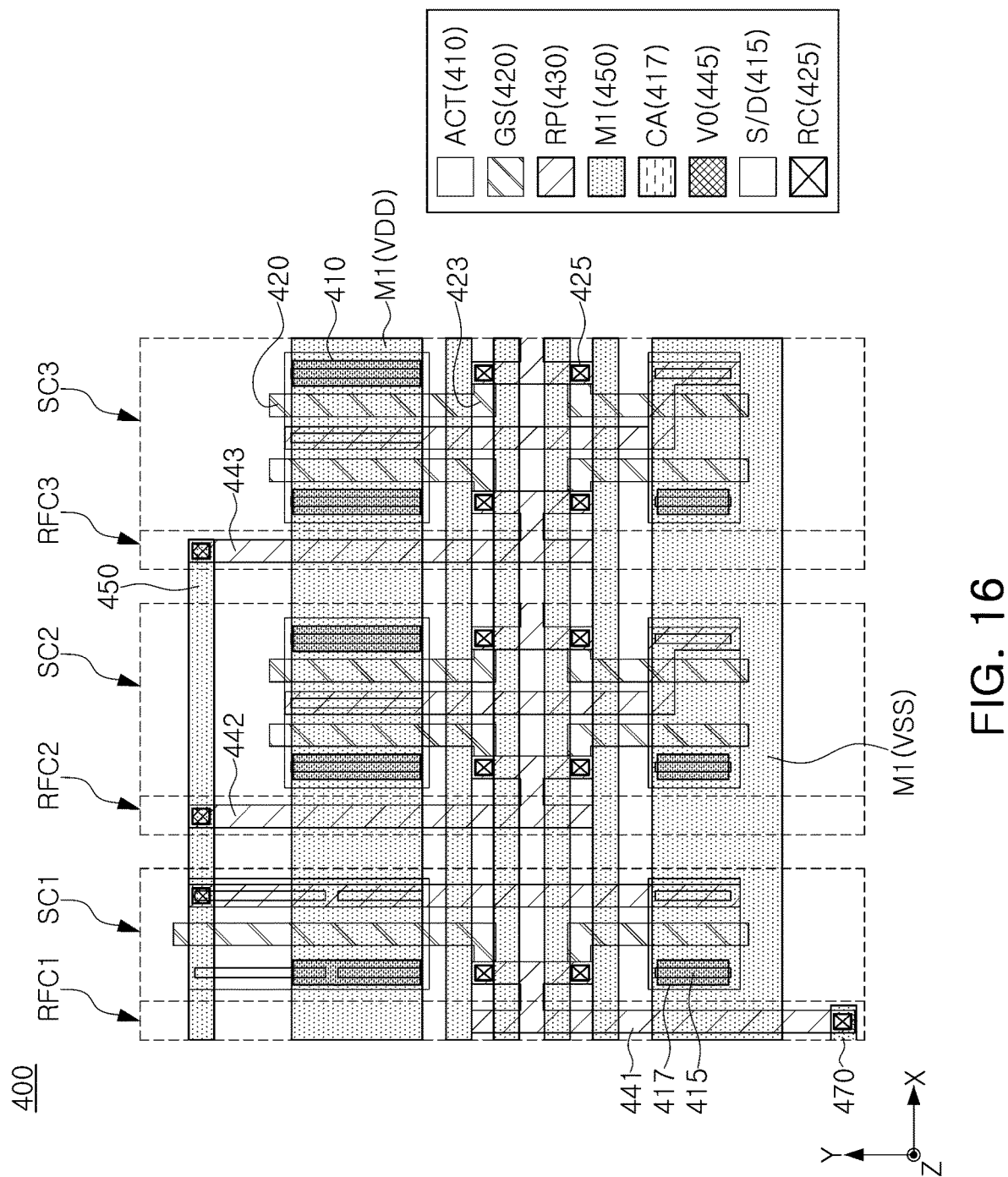
FIG. 16 is a schematic plan view of a partial region of a semiconductor device according to an example embodiment of the disclosure.

FIG. 16 is a schematic plan view of a partial region of a semiconductor device according to an example embodiment of the disclosure.

Referring to FIG. 16, a semiconductor device 400 according to an example embodiment of the disclosure may include a plurality of standard cells SC1 to SC3 and a plurality of routing filler cells RFC1 to RFC3. However, FIG. 16 illustrates a partial region of the semiconductor device 400, and the semiconductor device 400 may include more standard cells and filler cells.

Each of the first to third standard cells SC1 to SC3 may include a plurality of semiconductor elements, and each of the semiconductor elements may include an active region 410, a gate structure 420, and the like. The gate structure 420 may extend in a first direction (X-axis direction), and the active region 410 may be connected to a lower active contact 415 provided on both sides of the gate structure 420 in a second direction (Y-axis direction). Each of the first to third standard cells SC1 to SC3 may include a PMOS element and an NMOS element that are separated from each other in a first direction. Other components included in the semiconductor device 400 may be similar to those described above with reference to FIGS. 6 and 13.

In an example embodiment illustrated in FIG. 16, the first standard cell SC1 may provide an inverter circuit, and each of the second standard cell SC2 and the third standard cell SC3 may provide a NAND circuit. The gate structure 420 of each of the PMOS element and the NMOS element included in the first standard cell SC1 may be connected to a first routing interconnection 441 of a first routing filler cell RFC1 through an intermediate interconnection 430. The first routing interconnection 441 may extend in the first direction and be connected to a lower interconnection 470 below the NMOS element, and may provide an input node of an inverter circuit.

Meanwhile, the active region 410 of the PMOS element and the NMOS element may be connected to each other by an intermediate interconnection 430 in the first standard cell SC1. The intermediate interconnection 430 connecting the active region 410 may correspond to an output node of an inverter circuit, and may be connected to an upper interconnection 450 extending in a first direction and extending in a second direction through the lower via 445.

The second standard cell SC2 and the third standard cell SC3 may have the same structure. Referring to the second standard cell SC2 as an example, the second standard cell SC2 may include two PMOS elements and two NMOS elements, and a pair of gate structures 420 provided at the same position in the second direction and separated from each other in the first direction may be connected to each other by an intermediate interconnection 430. The intermediate interconnection 430 connecting the pair of gate structures 420 may provide an input node of a NAND circuit.

Referring to FIG. 16, a second routing interconnection 442 connected to a pair of gate structures included in the standard cell SC2 and provided in a second routing filler cell RFC2 may extend in a first direction and may be connected to the upper interconnection 450 above the PMOS element. Similarly, a third routing interconnection 443 connected a pair of gate structure 420 included in the third standard cell SC3 may extend in a first direction and may be connected to the upper interconnection 450. By the upper interconnection 450 connected in common to the intermediate interconnection 430 and the second and third routing interconnections 442 and 443, the output node of the inverter circuit provided by the first standard cell SC1 may be connected to the input node of each of the second standard cell SC2 and the third standard cell SC3.

Figure 17:
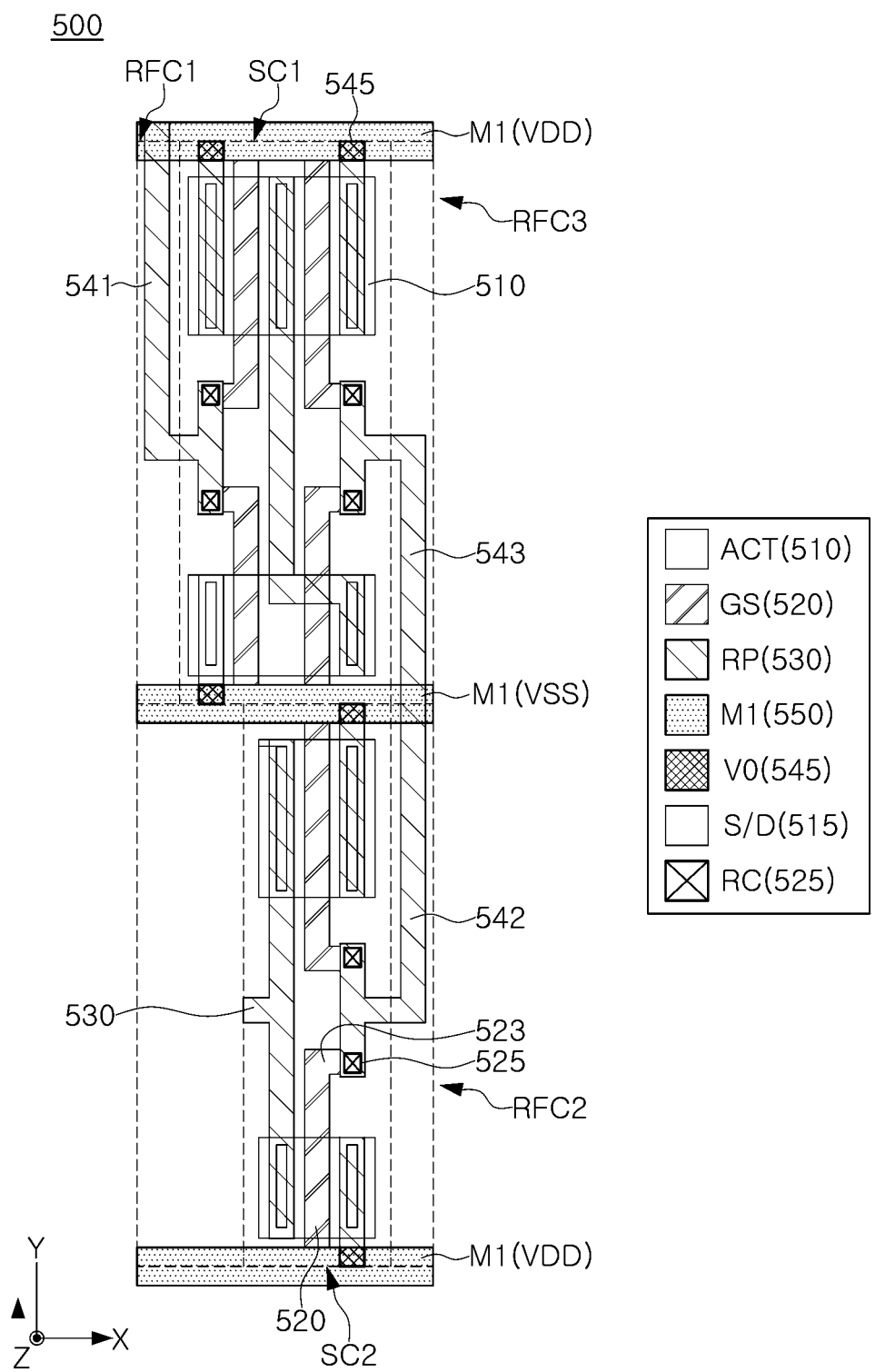
FIG. 17 is a schematic plan view illustrating a partial region of a semiconductor device according to an example embodiment of the disclosure.

FIG. 17 is a schematic plan view illustrating a partial region of a semiconductor device according to an example embodiment of the disclosure.

In a semiconductor device 500 according to an example embodiment illustrated in FIG. 17, power interconnections M1 (VDD) and M1 (VSS) may be arranged along a boundary between standard cells SC1 and SC2. For example, the first standard cell SC1 and the second standard cell SC2 may be adjacent to each other in a first direction (Y-axis direction), and a second power interconnection M1 (VSS) may extend in a second direction at a boundary between the first standard cell SC1 and the second standard cell SC2.

Each of the first standard cell SC1 and the second standard cell SC2 may include semiconductor elements, and may include, for example, a PMOS element and an NMOS element that are separated from each other in the first direction. A configuration of an active region 510, a lower active contact 515, a gate structure 520, an intermediate interconnection 530, and the like, included in each of the first standard cell SC1 and the second standard cell SC2 may be understood with reference to other example embodiments.

The first standard cell SC1 may be adjacent to a first routing filler cell RFC1 and a third routing filler cell RFC3 in a second direction (X-axis direction), the second standard cell SC2 may be adjacent to the second routing filler cell RFC2 in the second direction. Referring to FIG. 17, an intermediate interconnection 530 connecting a pair of gate structures provided at the same position in the second direction from the first standard cell SC1 may be connected to a first routing interconnection 541 of the first routing filler cell RFC1. Meanwhile, an intermediate interconnection 530 connecting the other pair of gate structures provided at the same position from the first standard cell SC1 may be connected to a third routing interconnection 543 of a third routing filler cell RFC3.

Meanwhile, the intermediate interconnection 530 connecting a pair of gate structures provided at the same position in the second direction in the second standard cell SC2 may be connected to the second routing filler 542 of the second routing filler cell RFC2. The second routing filler cell RFC2 may be provided to be adjacent to the third routing interconnection cell RFC3 in the first direction. Therefore, as illustrated in FIG. 16, the second routing interconnection 542 and the third routing interconnection 543 may be integrally connected below the second power interconnection (M1 (VSS)) in the third direction (Z-axis direction).

In an example embodiment illustrated in FIG. 17, as described above, using the routing interconnections 541 to 543 included in each of the routing filler cells RFC1-RFC3, the intermediate interconnection 530 of each of the standard cells SC1 and SC2 may be connected to each other. Accordingly, since a routing path connecting semiconductor elements to each other without passing upper interconnections provided above the semiconductor elements in the third direction may be secured, a degree of freedom of design of the upper interconnections may be improved, and the routing path connecting the semiconductor elements may be effectively designed, and at the same time, the performance of the semiconductor device 500 may be improved by shortening the routing path.

Figure 18:
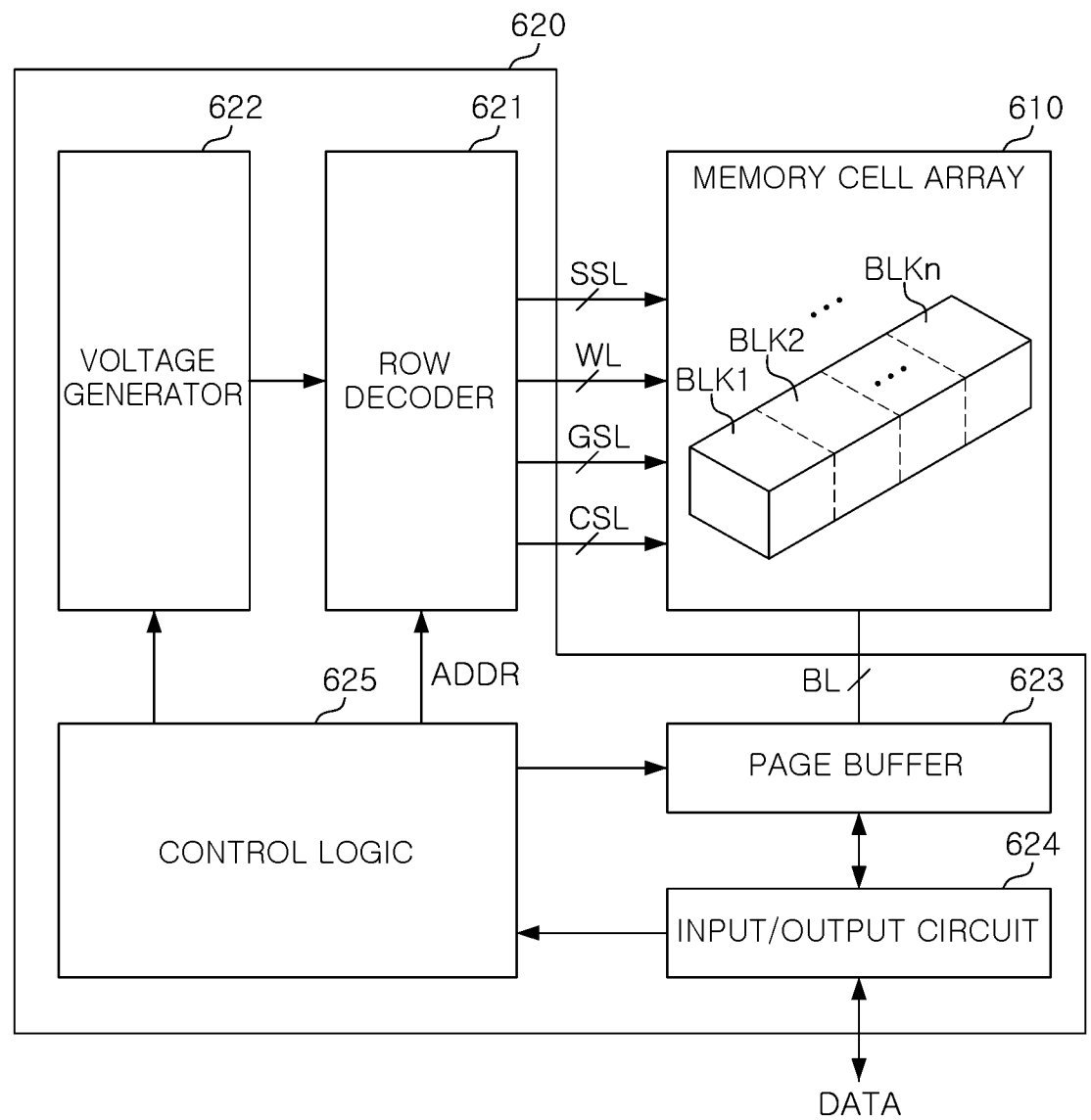
FIGS. 18 to 20 are diagrams provided to illustrate a semiconductor device according to an example embodiment of the disclosure.
Figure 19:
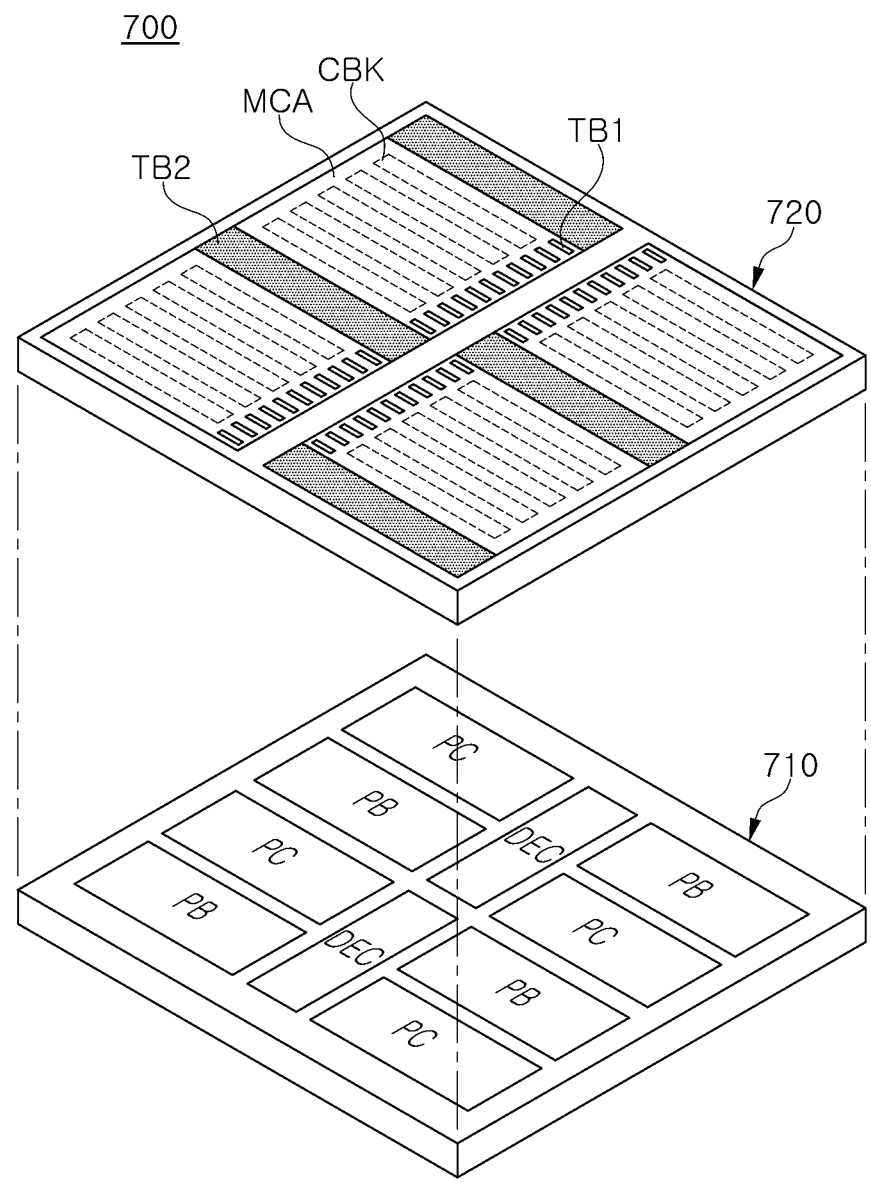
Figure 20:
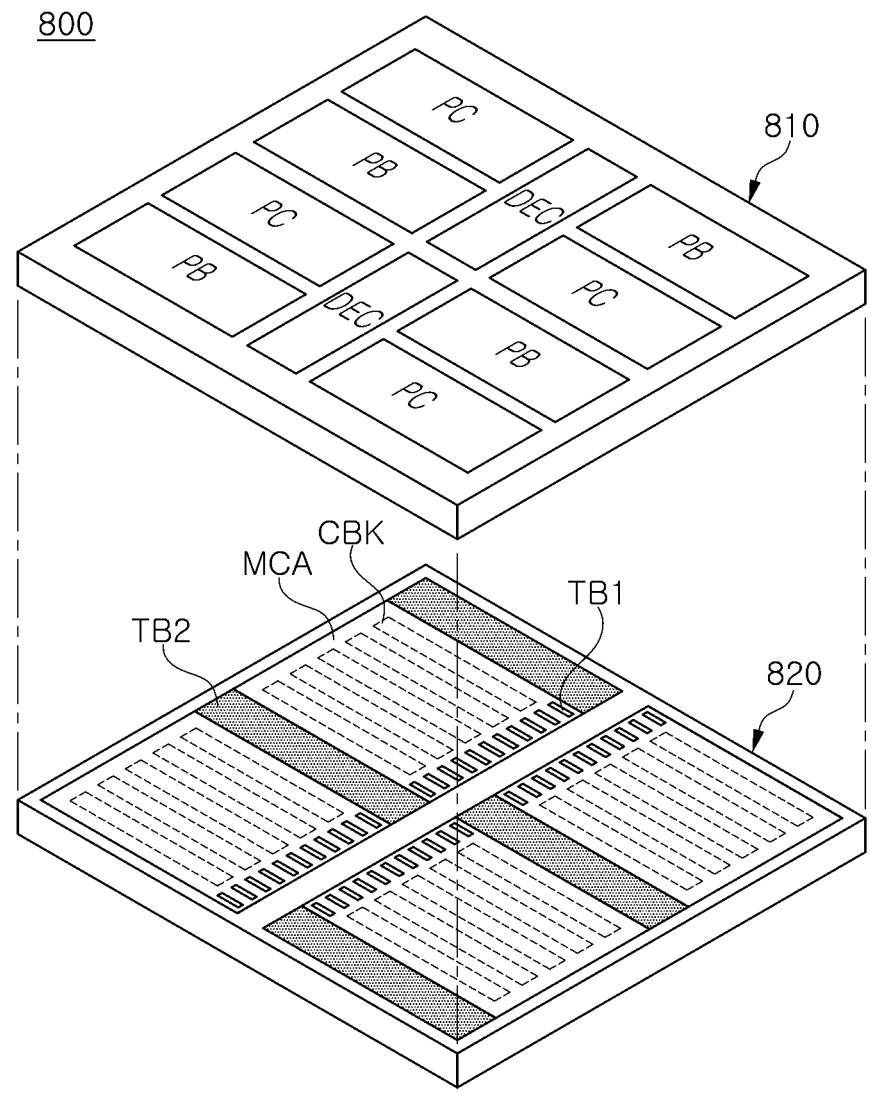

FIGS. 18 to 20 are diagrams provided to illustrate a semiconductor device according to an example embodiment of the disclosure.

Referring, first to FIG. 18, a memory device 600 may include a cell region 610 a peripheral circuit region 620. The peripheral circuit region 620 may include a row decoder 621, a voltage generator 622, a page buffer 623, an input/output circuit 624, a control logic 625.

The cell region 610 may include a plurality of memory cells, and may be divided into a plurality of blocks BLK1-BLKn. The plurality of memory cells may be connected to the row decoder 621 through a string selection line SSL, a word line WL, a ground selection line GSL, and a common source line CSL, and may be connected to the page buffer 623 through bit lines BL.

The row decoder 621 may decode address data ADDR input from the control logic 625, or the like, to input voltages for driving a string selection line SSL, a word line WL, a ground selection line GSL, and a common source line CSL to the cell region 610. The voltage generator 622 may generate a voltage required for an operation of the memory device 600 in response to control of the control logic 625. For example, the peripheral circuit region 620 may be divided into a high voltage region and a low voltage region according to a level of the power voltage input to the semiconductor elements, and according to an example embodiment, the peripheral circuit region 620 may further include a medium voltage region receiving a power voltage, lower than that in the high voltage region and higher than that in the low voltage region.

The input/output circuit 624 may receive data during a program operation and transfer the date to the page buffer 623, and during a read operation, may output date read from the cell region 610 by the page buffer 623 externally. The input/output circuit 624 may transmit an address or a command input from an external controller to the control logic 625.

The peripheral circuit region 620 excluding the cell region 610 may be designed in the same layout as described above with reference to FIGS. 1 to 17. For example, in order to design a row decoder 621, a voltage generator 622, a page buffer 623, an input/output circuit 624, and a control logic 625 included in the peripheral circuit region 620, when standard cells and filler cells are provided and there is a standard cell in which it is difficult to secure a routing path, a routing filler cell, adjacent to the corresponding standard cell may be additionally provided and positions of other standard cells and filler cells may be adjusted. Alternatively, when a filler cell adjacent to the corresponding standard cell exists, the corresponding filler cell may be substituted with a routing filler cell. The routing filler cell may include a routing interconnection connected at the same height as an intermediate interconnection in the standard cell, and may connect the corresponding standard cell to the other one standard cell by connecting the routing interconnection to the upper interconnection and/or the lower interconnection.

According to example embodiments, the cell region 610 and the peripheral circuit region 620 may be formed on different substrates and stacked in a vertical direction. Referring to FIG. 19, a semiconductor device 700 may include a first region 710 and a second region 720 stacked in a vertical direction (Z-axis direction). The first region 710 is a peripheral circuit region, and may include a row decoder DEC, a page buffer PB, and a peripheral circuit PC formed on a first substrate. For example, the peripheral circuit PC may include a voltage generator, a source driver, an input/output circuit, and the like.

The second region 720 is a cell region, and may include memory cell arrays MCA and first and second through interconnection regions TB1 and TB2 formed on a second substrate. Through interconnections connecting the first region 710 and the second region 720 and extending in a vertical direction may be provided in each of the first and second interconnection regions TB1 and TB2. Each of the memory cell arrays MCA may include cell blocks CBK arranged in a first direction (Y-axis direction). According to example embodiments, at least one dummy block may be provided between at least a portion of the cell blocks CBK.

The first region 710 may include a plurality of semiconductor elements for implementing the circuits and interconnections connected to the semiconductor elements. When the first region 710 is implemented according to an example embodiment of the disclosure, the first region 710 may include lower interconnections, intermediate interconnections, and upper interconnections connecting semiconductor elements, and at least a portion of intermediate interconnections may be connected to the lower interconnection and/or the upper interconnection through the routing interconnection of the routing filler cell adjacent to the standard cell.

Next, referring to FIG. 20, a semiconductor device 800 may include a first region 810 and a second region 820 stacked in a vertical direction (Z-axis direction). The first region 810 may be a peripheral circuit region, and the second region 820 may be a cell region. The configuration of each of the first region 810 and the second region 820 may be similar to that described above with reference to FIG. 19.

However, unlike the example embodiment previously described with reference to FIG. 19, in an example embodiment illustrated in FIG. 20, the first region 810 including a peripheral circuit region may be coupled to the second region 820 in a state of being inverted. Accordingly, semiconductor elements included in the first region 810 and providing a row decoder DEC, a page buffer PB, and a peripheral circuit PC, gate electrode layers, bit lines, and the like, included in the second region 820 may be provided between a first substrate of the first region 810 and a second substrate of the second region 820. For example, in an example embodiment illustrated in FIG. 20, each of the first region 810 and the second region 820 may be formed on separate wafers, and then the first region 810 or the second region 820 may be inverted and attached thereto to form the memory device 800.

As set forth above, according to an example embodiment of the disclosure, a semiconductor device including standard cells and filler cells provided between the standard cells may be provided, and at least one routing filler cell including a routing interconnection may be added to connect intermediate interconnections included in at least a portion of the standard cells during a layout process of the semiconductor device. Accordingly, by connecting the standard cells to each other by maximizing the intermediate interconnection, a degree of integration of the semiconductor device can be improved, the interconnections can be efficiently designed, and convenience of layout can be increased.

While the example embodiments have been illustrated and described above, it will be apparent to those skilled in the art that modifications and variations could be made without departing from the scope of the present disclosure as defined by the appended claims.

What is claimed is:

1. A semiconductor device, comprising:
a plurality of semiconductor elements, each of the plurality of semiconductor elements including a gate structure extending in a first direction, parallel to an upper surface of a substrate, and an active region provided on both sides of the gate structure in a second direction intersecting the first direction; and
a plurality of interconnection patterns connected to the plurality of semiconductor elements,
wherein the plurality of interconnection patterns include:
a plurality of upper interconnections provided above the plurality of semiconductor elements in a third direction perpendicular to the upper surface of the substrate,
a plurality of intermediate interconnections provided between the plurality of semiconductor elements and the plurality of upper interconnections in the third direction, and
a routing interconnection extending in the first direction and adjacent to at least one of the plurality of semiconductor elements in the second direction, a length of the routing interconnection in the first direction is greater than a length of the active region in the first direction,
wherein the routing interconnection is connected to at least one of the plurality of intermediate interconnections in the first direction or the second direction.

2. The semiconductor device of claim 1, further comprising a plurality of contacts connecting each of the plurality of upper interconnections to at least one of the plurality of semiconductor elements, wherein the plurality of intermediate interconnections and the routing interconnection are provided at a same height as the plurality of contacts in the third direction.

3. The semiconductor device of claim 1, wherein the plurality of upper interconnections extend in the second direction, wherein the plurality of upper interconnections comprise a first power interconnection overlapping a plurality of PMOS elements among the plurality of semiconductor elements, a second power interconnection overlapping a plurality of NMOS elements among the plurality of semiconductor elements, and a plurality of signal interconnections separated from the first power interconnection and the second power interconnection in the first direction.

4. The semiconductor device of claim 3, wherein the routing interconnection is connected to at least one signal interconnection from the plurality of signal interconnections.

5. The semiconductor device of claim 4, wherein the at least one signal interconnection connected to the routing interconnection is not provided between the first power interconnection and the second power interconnection in the first direction.

6. The semiconductor device of claim 1, further comprising:
a PMOS element region in which a plurality of PMOS elements of the plurality of semiconductor elements are provided, an NMOS element region in which a plurality of NMOS elements of the plurality of semiconductor elements are provided, and an element isolation region, different from the PMOS element region and the NMOS element region,
wherein the PMOS element region, the NMOS element region, and the element isolation region are arranged in the first direction.

7. The semiconductor device of claim 6, wherein the routing interconnection intersects at least one of the PMOS element region and the NMOS element region and extends in the first direction.

8. The semiconductor device of claim 7, wherein the element isolation region comprises a first element isolation region provided between the PMOS element region and the NMOS element region in the first direction, a second element isolation region provided over the PMOS element region in the first direction, and a third element isolation region provided below the NMOS element region in the first direction, wherein the routing interconnection is connected to at least one of the plurality of intermediate interconnections in the first element isolation region.

9. The semiconductor device of claim 8, wherein the routing interconnection extends from the first element isolation region to the second element isolation region or the third element isolation region.

10. The semiconductor device of claim 8, wherein the routing interconnection is connected to at least one of the plurality of upper interconnections in the second element isolation region or the third element isolation region.

11. The semiconductor device of claim 8, further comprising:
a plurality of lower interconnections provided at a same height as the gate structure in the third direction, and provided in at least one of the second element isolation region and the third element isolation region,
wherein the routing interconnection is connected to at least one of the plurality lower interconnections in the second element isolation region or the third element isolation region.

12. The semiconductor device of claim 6, wherein the gate structure included in at least one of the plurality of semiconductor elements comprises a gate tap structure extending from the first direction to the element isolation region, and extending from the element isolation region in the second direction.

13. A semiconductor device, comprising:
a plurality of standard cells arranged in a first direction and a second direction, the first and the second direction being parallel to an upper surface of a substrate and intersecting each other, and each of the plurality of standard cells including a plurality of semiconductor elements; and
a plurality of filler cells provided adjacent to one or more of the plurality of standard cells, the plurality of filler cells including a routing filler cell,
wherein the routing filler cell includes a routing interconnection connected, via an intermediate interconnection, to at least one of the plurality of semiconductor elements included in a neighboring standard cell that is adjacent to the routing filler cell in the second direction,
wherein the routing interconnection extends in the first direction parallel to a gate structure of each of the plurality of semiconductor elements, and
wherein the intermediate interconnection and the routing interconnection are provided at a same height as contacts connected to the plurality of semiconductor elements.

14. The semiconductor device of claim 13, further comprising,
a plurality of upper interconnections extending in the second direction are provided above the plurality of semiconductor elements in a third direction perpendicular to the upper surface of the substrate,
wherein the plurality of upper interconnections include a plurality of power interconnections for supplying a power voltage and a plurality of signal interconnections provided at first positions different from second positions at which the plurality of power supply interconnections are provided,
wherein the intermediate interconnection is provided below the signal interconnections.

15. The semiconductor device of claim 14, wherein the routing interconnection extends in the first direction below at least one of the plurality of power interconnections.

16. The semiconductor device of claim 14, wherein a first width of each of the plurality of power interconnections in the first direction is greater than a second width of each of the plurality of signal interconnections in the first direction.

17. The semiconductor device of claim 14, wherein the plurality of power interconnections comprise a first power interconnection for supplying a first power voltage, and a second power line for supplying a second power voltage, lower than the first power voltage, wherein the routing filler cell comprises a first routing interconnection extending in the first direction below the first power interconnection and a second routing interconnection extending in the first direction below the second power interconnection.

18. The semiconductor device of claim 17, wherein a first length of the first routing interconnection in the first direction is different from a second length of the second routing interconnection in the first direction.

19. The semiconductor device of claim 13, wherein at least a partial region of the intermediate interconnection connected to the routing interconnection is provided at a same position as a portion of an active region included in the neighboring standard cell in the second direction.

20. A semiconductor device, comprising:
a plurality of standard cells arranged in a first direction, parallel to an upper surface of a substrate and a second direction intersecting the first direction and including a first standard cell and a second standard cell, each of the plurality of standard cells including a plurality of semiconductor elements; and
a plurality of filler cells provided adjacent to one or more of the plurality of standard cells, the plurality of filler cells including a first routing filler cell and a second routing filler cell,
wherein the first routing filler cell includes a first routing interconnection connected to a first gate structure of the first standard cell via a first intermediate interconnection, and the second routing filler cell includes a second routing interconnection connected to a second gate structure of the second standard cell via a second intermediate interconnection,
wherein the first routing interconnection, the second routing interconnection, the first intermediate interconnection, and the second intermediate interconnection are provided at a same height,
wherein the first intermediate interconnection is connected to the first routing interconnection in the second direction at a first boundary between the first standard cell and the first routing filler cell, and
wherein the second intermediate interconnection is connected to the second routing interconnection in the second direction at a second boundary between the second standard cell and the second routing filler cell.

* * * * *